(12) United States Patent
Wang et al.

(10) Patent No.: US 10,867,842 B2
(45) Date of Patent: Dec. 15, 2020

(54) METHOD FOR SHRINKING OPENINGS IN FORMING INTEGRATED CIRCUITS

(71) Applicant: Taiwan Semiconductor Manufacturing Company, Ltd., Hsinchu (TW)

(72) Inventors: Peng Wang, Hsinchu (TW); Yu-Lien Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/176,116

(22) Filed: Oct. 31, 2018

(65) Prior Publication Data
US 2020/0135546 A1    Apr. 30, 2020

(51) Int. Cl.
*H01L 21/768*    (2006.01)
*H01L 21/311*    (2006.01)
(Continued)

(52) U.S. Cl.
CPC .... *H01L 21/76816* (2013.01); *H01L 21/0214* (2013.01); *H01L 21/02532* (2013.01); *H01L 21/0332* (2013.01); *H01L 21/0337* (2013.01); *H01L 21/0338* (2013.01); *H01L 21/31116* (2013.01); *H01L 21/31144* (2013.01); *H01L 21/76877* (2013.01); *H01L 21/823475* (2013.01); *H01L 21/31053* (2013.01); *H01L 21/823418* (2013.01); *H01L 21/823431* (2013.01); *H01L 21/823437* (2013.01); *H01L 21/823481* (2013.01); *H01L 29/665* (2013.01); *H01L 29/66545* (2013.01); *H01L 29/66636* (2013.01)

(58) Field of Classification Search
CPC ............. H01L 21/0338; H01L 21/0337; H01L 21/0332; H01L 21/76804; H01L 21/31144; H01L 21/76811; H01L 21/02126; H01L 21/0214; H01L 21/0276; H01L 21/76816; G03F 7/095; G03F 7/094; G03F 7/0757; G03F 7/0755
See application file for complete search history.

(56) References Cited

U.S. PATENT DOCUMENTS 4,814,041 A *   3/1989   Auda ................ H01L 21/31116
                                           257/E21.252
5,913,148 A *   6/1999   Hills ..................... H01L 21/033
                                           257/E21.578

(Continued)

*Primary Examiner* — Sophia T Nguyen
(74) *Attorney, Agent, or Firm* — Slater Matsil, LLP

(57) ABSTRACT

A method includes forming a first hard mask layer and a second hard mask layer over the first hard mask layer, and forming a tri-layer including a bottom layer, a middle layer, and a patterned upper layer. The method further includes etching the middle layer to extend an opening in the patterned upper layer into the middle layer, wherein the opening has a first portion in the middle layer, and the first portion has a first top width and a first bottom width smaller than the first top width; etching the bottom layer to extend the opening into the bottom layer; and etching the second hard mask layer to extend the opening into the second hard mask layer. The opening has a second portion in the second hard mask layer, and the second portion has a second top width and a second bottom width smaller than the second top width.

19 Claims, 30 Drawing Sheets

(51) Int. Cl.
*H01L 29/66* (2006.01)
*H01L 21/033* (2006.01)
*H01L 21/8234* (2006.01)
*H01L 21/02* (2006.01)
*H01L 21/3105* (2006.01)

(56) References Cited

U.S. PATENT DOCUMENTS

| | | | | |
|---|---|---|---|---|
| 6,117,782 | A * | 9/2000 | Lukanc | H01L 21/76804 216/38 |
| 6,211,071 | B1 * | 4/2001 | Lukanc | H01L 21/2885 257/E21.175 |
| 6,387,798 | B1 * | 5/2002 | Loke | H01L 21/76804 257/E21.578 |
| 6,479,380 | B2 * | 11/2002 | Furusawa | H01L 21/31144 438/638 |
| 6,514,868 | B1 * | 2/2003 | Hui | H01L 21/31144 216/67 |
| 6,518,174 | B2 * | 2/2003 | Annapragada | H01L 21/31116 257/E21.252 |
| 6,548,347 | B2 * | 4/2003 | Juengling | H01L 27/10873 257/E21.654 |
| 6,576,548 | B1 * | 6/2003 | Tu | H01L 21/31105 257/E21.25 |
| 6,743,712 | B2 * | 6/2004 | Park | H01L 21/0276 257/E21.029 |
| 6,774,032 | B1 * | 8/2004 | Park | H01L 21/76804 257/E21.577 |
| 6,858,542 | B2 * | 2/2005 | Sparks | H01L 21/3083 257/E21.233 |
| 6,953,746 | B2 * | 10/2005 | Uesawa | H01L 21/31144 257/E21.256 |
| 7,030,008 | B2 * | 4/2006 | Allen | H01L 21/0276 257/E21.029 |
| 7,259,089 | B2 * | 8/2007 | Kanamura | H01L 21/76801 257/E21.576 |
| 7,297,628 | B2 * | 11/2007 | Chao | H01L 21/76816 438/635 |
| 7,361,588 | B2 * | 4/2008 | Jones | H01L 21/3088 257/E21.026 |
| 8,252,192 | B2 * | 8/2012 | Lee | H01L 21/31116 216/47 |
| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 8,951,907 | B2 * | 2/2015 | Richter | H01L 21/28512 438/626 |
| 9,054,158 | B2 * | 6/2015 | Farber | H01L 21/76804 |
| 9,059,250 | B2 * | 6/2015 | Choi | H01L 21/76816 |
| 9,105,490 | B2 | 8/2015 | Wang et al. | |
| 9,159,580 | B2 * | 10/2015 | Yen | H01L 21/31116 |
| 9,159,581 | B2 * | 10/2015 | Li | H01L 21/31116 |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 9,634,141 | B1 * | 4/2017 | Wang | H01L 21/76802 |
| 9,685,439 | B1 * | 6/2017 | Lee | H01L 27/0886 |
| 9,812,358 | B1 * | 11/2017 | Huang | H01L 21/76897 |
| 9,818,640 | B1 * | 11/2017 | Stephens | H01L 21/76816 |
| 9,837,538 | B2 * | 12/2017 | Chien | H01L 29/165 |
| 9,881,834 | B1 * | 1/2018 | Sun | H01L 21/76877 |
| 10,510,586 | B1 * | 12/2019 | Liou | H01L 21/02211 |
| 10,515,797 | B2 * | 12/2019 | Furumoto | H01L 21/28079 |
| 2001/0046783 | A1 * | 11/2001 | Furusawa | H01L 21/31144 438/736 |
| 2005/0095838 | A1 * | 5/2005 | Jeong | H01L 21/76838 438/622 |
| 2007/0099414 | A1 * | 5/2007 | Frohberg | H01L 21/76877 438/618 |
| 2008/0064203 | A1 * | 3/2008 | Chou | H01L 21/0271 438/637 |
| 2008/0305595 | A1 * | 12/2008 | Kwon | H01L 21/76816 438/279 |
| 2009/0035944 | A1 | 2/2009 | Chiang et al. | |
| 2009/0191711 | A1 * | 7/2009 | Rui | G03F 7/40 438/695 |
| 2010/0055902 | A1 * | 3/2010 | Frohberg | H01L 21/0337 438/675 |
| 2010/0144155 | A1 * | 6/2010 | Yatsuda | H01L 21/0337 438/700 |
| 2012/0104619 | A1 * | 5/2012 | Ponoth | H01L 21/3105 257/773 |
| 2012/0161327 | A1 * | 6/2012 | Chumakov | H01L 21/76804 257/773 |
| 2012/0244710 | A1 * | 9/2012 | Chumakov | H01L 21/0337 438/701 |
| 2012/0302056 | A1 * | 11/2012 | Chen | H01L 21/76811 438/636 |
| 2012/0329272 | A1 * | 12/2012 | Arnold | H01L 21/0337 438/653 |
| 2013/0137269 | A1 * | 5/2013 | Geiss | H01L 21/0337 438/697 |
| 2013/0214391 | A1 * | 8/2013 | Choi | H01L 21/76816 257/622 |
| 2014/0024220 | A1 | 1/2014 | Chang et al. | |
| 2014/0110755 | A1 * | 4/2014 | Colinge | H01L 21/324 257/192 |
| 2014/0145313 | A1 * | 5/2014 | Li | H01L 21/31116 257/635 |
| 2014/0170853 | A1 | 6/2014 | Shamma et al. | |
| 2014/0327117 | A1 * | 11/2014 | Bencher | C23C 14/0042 257/649 |
| 2015/0072494 | A1 * | 3/2015 | Lin | H01L 29/665 438/283 |
| 2015/0093901 | A1 * | 4/2015 | Ogihara | G03F 7/0752 438/702 |
| 2015/0262836 | A1 * | 9/2015 | Lu | H01L 21/31138 438/703 |
| 2015/0279840 | A1 * | 10/2015 | Huang | H01L 29/66545 257/384 |
| 2016/0284537 | A1 * | 9/2016 | Liu | H01L 21/0271 |
| 2018/0040615 | A1 * | 2/2018 | Chang | H01L 27/0886 |
| 2018/0175165 | A1 * | 6/2018 | Lim | H01L 29/66583 |
| 2018/0175201 | A1 * | 6/2018 | Wang | H01L 29/4966 |
| 2018/0190809 | A1 * | 7/2018 | Huang | H01L 29/0847 |
| 2018/0294184 | A1 * | 10/2018 | Koh | H01L 27/0886 |
| 2018/0337188 | A1 * | 11/2018 | Yu | H01L 21/823475 |
| 2019/0164759 | A1 * | 5/2019 | Huang | H01L 21/0337 |
| 2019/0165270 | A1 * | 5/2019 | Lin | H01L 45/00 |
| 2019/0334008 | A1 * | 10/2019 | Chen | H01L 29/6653 |
| 2019/0391481 | A1 * | 12/2019 | Xu | G03F 7/42 |
| 2020/0006072 | A1 * | 1/2020 | Peng | H01L 21/02274 |
| 2020/0083436 | A1 * | 3/2020 | Yang | H01L 27/222 |

* cited by examiner

METHOD FOR SHRINKING OPENINGS IN FORMING INTEGRATED CIRCUITS

BACKGROUND

In the manufacturing of integrated circuits, source/drain contact plugs are used for connecting to the source and drain regions and the gates of transistors. The source/drain contact plugs are typically connected to source/drain silicide regions, whose formation process includes forming contact openings in an inter-layer dielectric, depositing a metal layer extending into the contact openings, and then performing an anneal to react the metal layer with the silicon/germanium of the source/drain regions. The source/drain contact plugs are then formed in the remaining contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
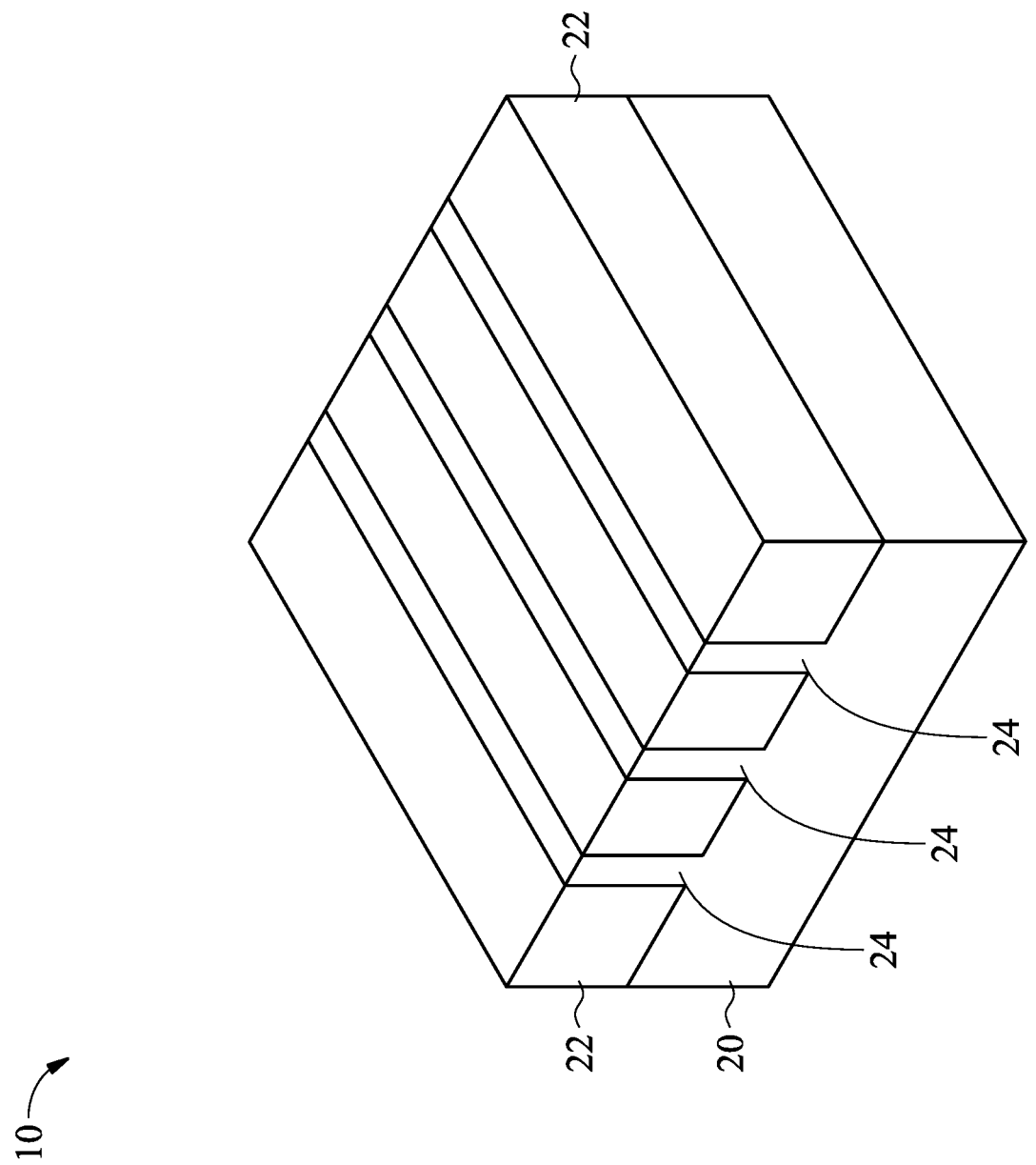
FIG. 1 through 8, 9A, 9B, 10A, 10B, 11, 12, 13A, 13B, 14A, 14B, 15A, 15B, 16A, 16B, 16C, 17A, 17B, 17C, 18A, 18B, and 18C illustrate the perspective views, top views, and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor including source/drain contact plugs and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments of the present disclosure, a method of reducing the widths of source/drain contact openings to be smaller than the limit of lithography processes is discussed. The widths of the contact opening are shrunk by reducing the size of the corresponding openings in etching masks that are used for forming the contact openings.

In accordance with some embodiments, the formation of Fin Field-Effect Transistors (FinFETs) is used as an example to explain the concept of the present disclosure. Planar transistors may also adopt the concept of the present disclosure. Furthermore, the method for forming openings in accordance with some embodiments may be used for forming openings other than source/drain contact openings. For example, gate contact openings, through-silicon vias, metal lines and vias in dielectric layers (such as in low-k dielectric layers) may be formed adopting the methods of the present disclosure.

FIGS. 1 through 8, 9A, 9B, 10A, 10B, 11, 12, 13A, 13B, 14A, 14B, 15A, 15B, 16A, 16B, 16C, 17A, 17B, 17C, 18A, 18B, and 18C illustrate the cross-sectional views, top views, and perspective views of intermediate stages in the formation of Fin Field-Effect Transistors (FinFETs) and source/drain contact plugs in accordance with some embodiments of the present disclosure. The formation processes are shown in the process flow 200 as in FIG. 19.

FIG. 1 illustrates a perspective view of an initial structure formed on wafer 10, which includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 also includes a dielectric material over the liner oxide, wherein the dielectric material may be formed using Flowable Chemical Vapor Deposition (FCVD), spin-on, or the like.

Figure 2:
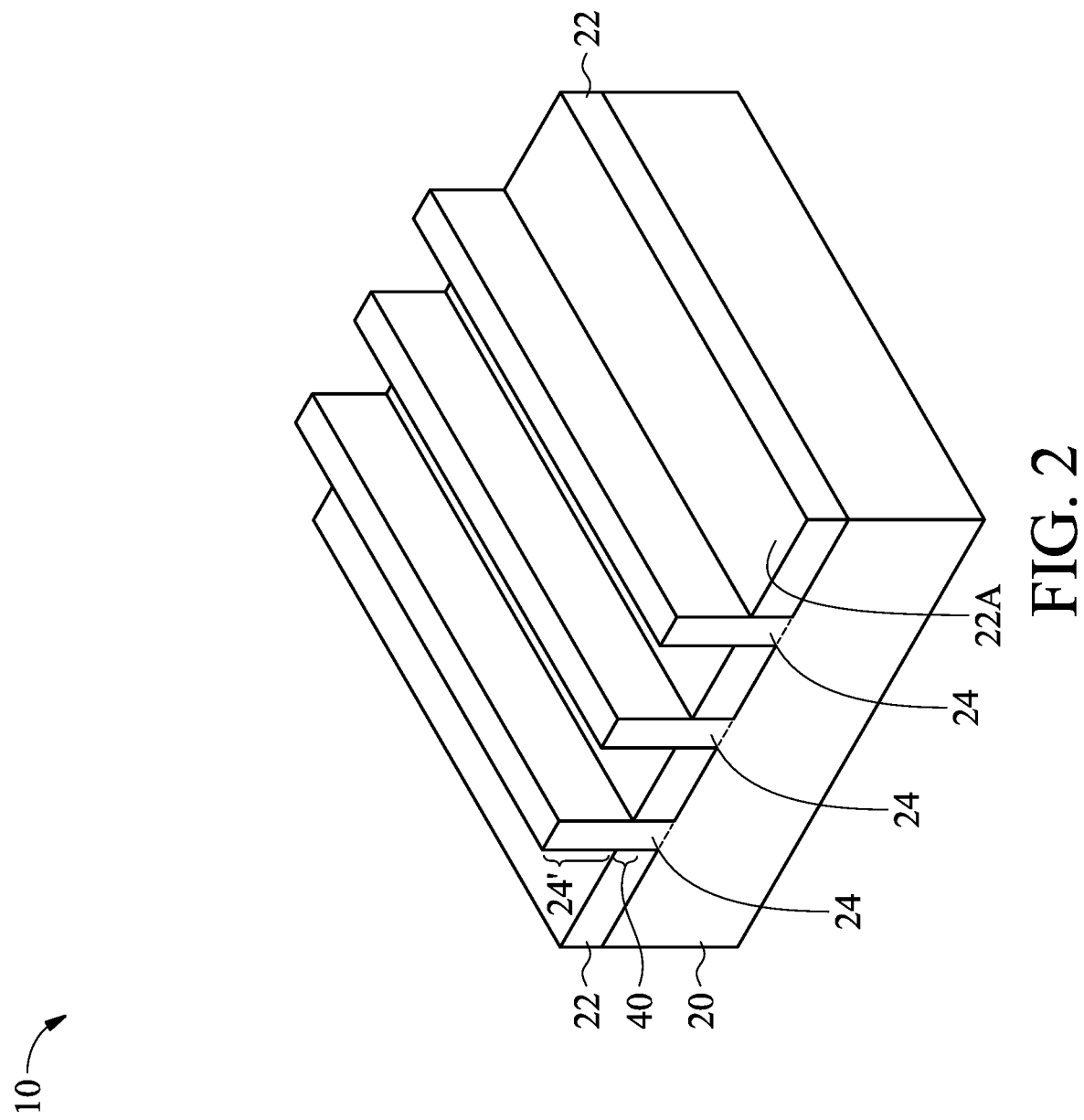

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow 200 shown in FIG. 19. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
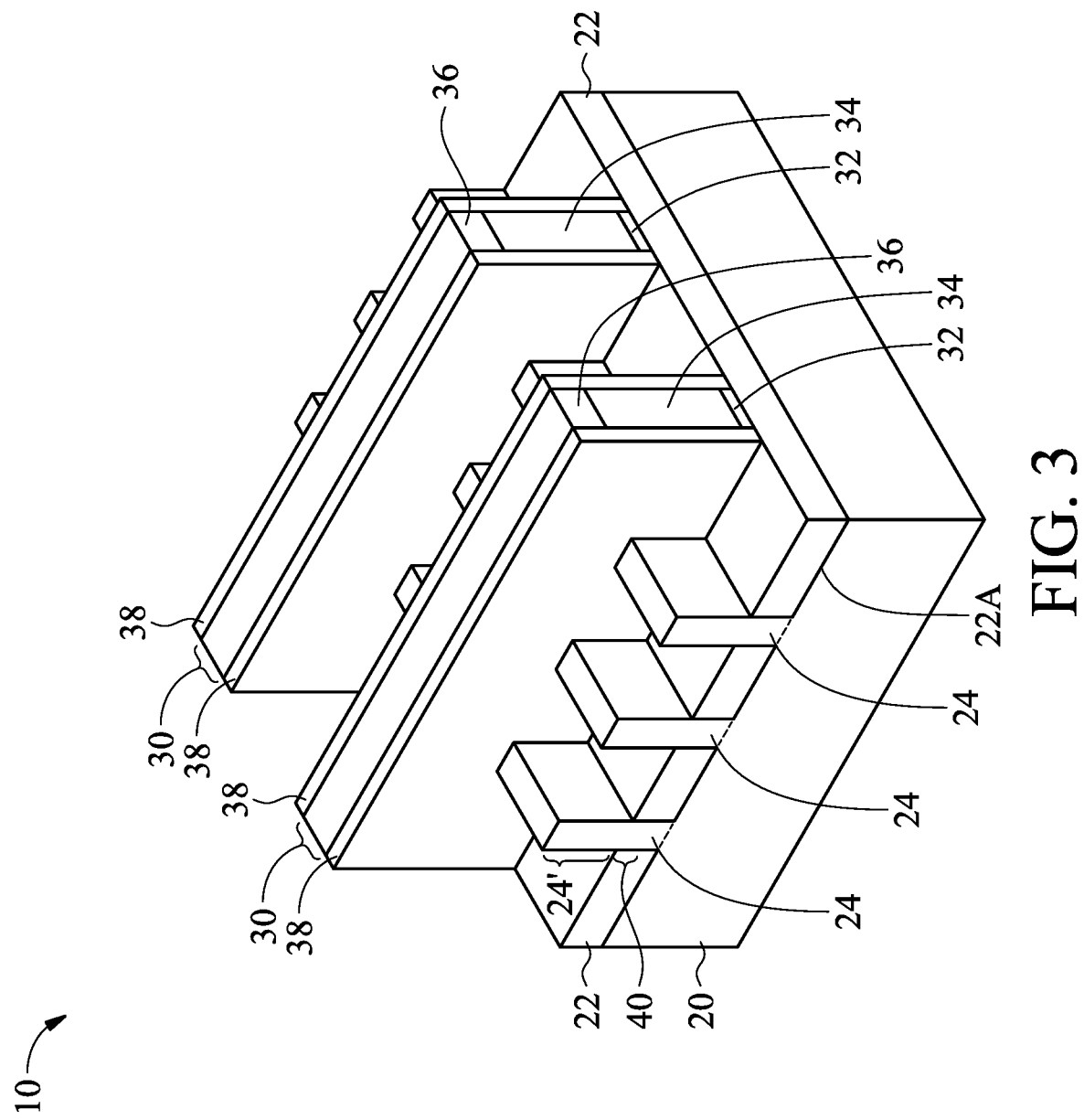

Referring to FIG. 3, dummy gate stacks 30 are formed to extend on the top surfaces and the sidewalls of (protruding) fins 24'. The respective process is illustrated as process 204 in the process flow 200 shown in FIG. 19. Dummy gate stacks 30 may include dummy gate dielectrics 32 and dummy gate electrodes 34 over dummy gate dielectrics 32. Dummy gate electrodes 34 may be formed, for example, using polysilicon or amorphous silicon, and other materials may also be used. Each of dummy gate stacks 30 may also include one (or a plurality of) hard mask layer 36 over the corresponding dummy gate electrodes 34. Hard mask layers 36 may be formed of silicon nitride, silicon oxide, silicon carbo-nitride, or the like, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 204 in the process flow 200 shown in FIG. 19. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
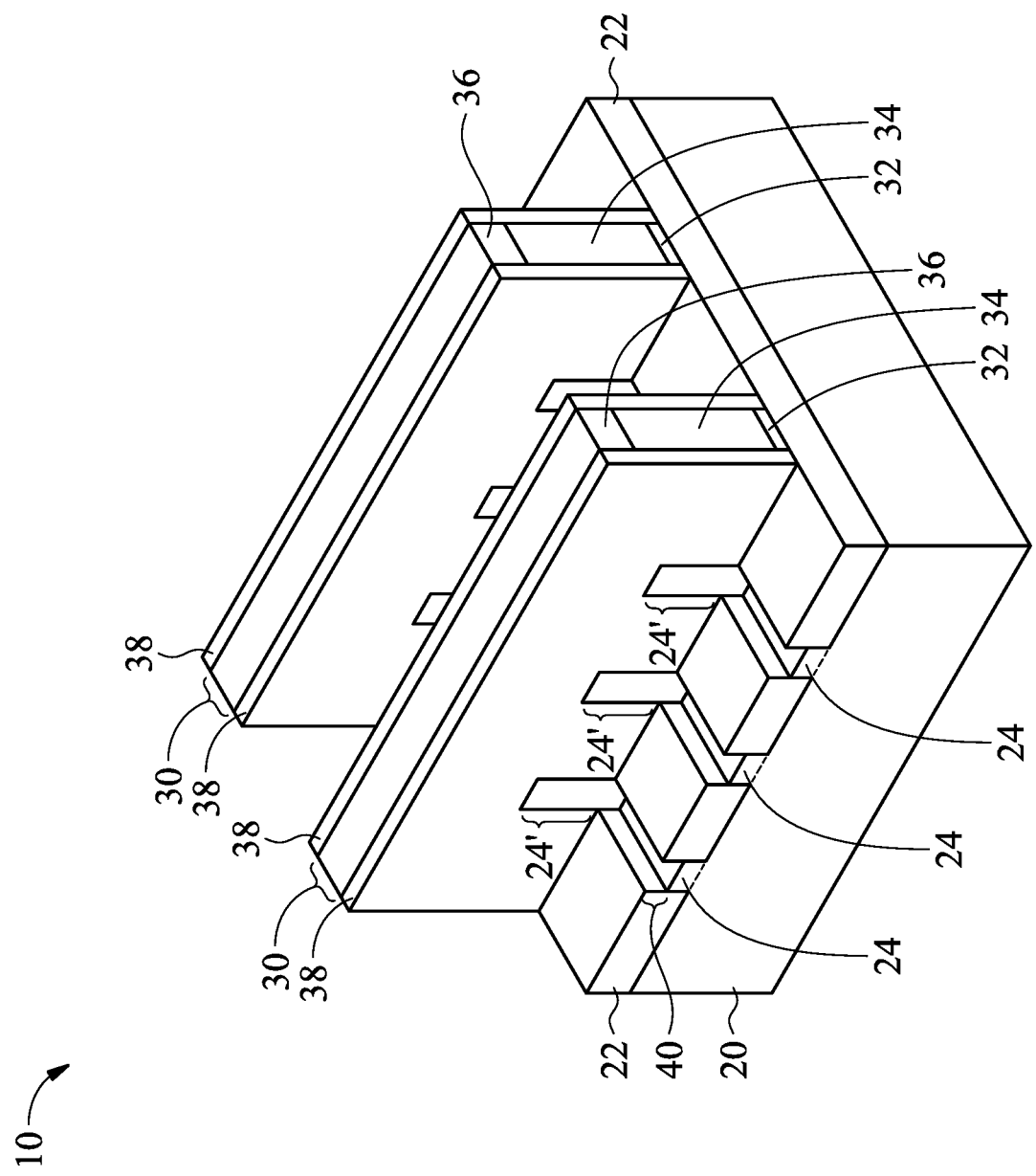

An etching process may then be performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5:
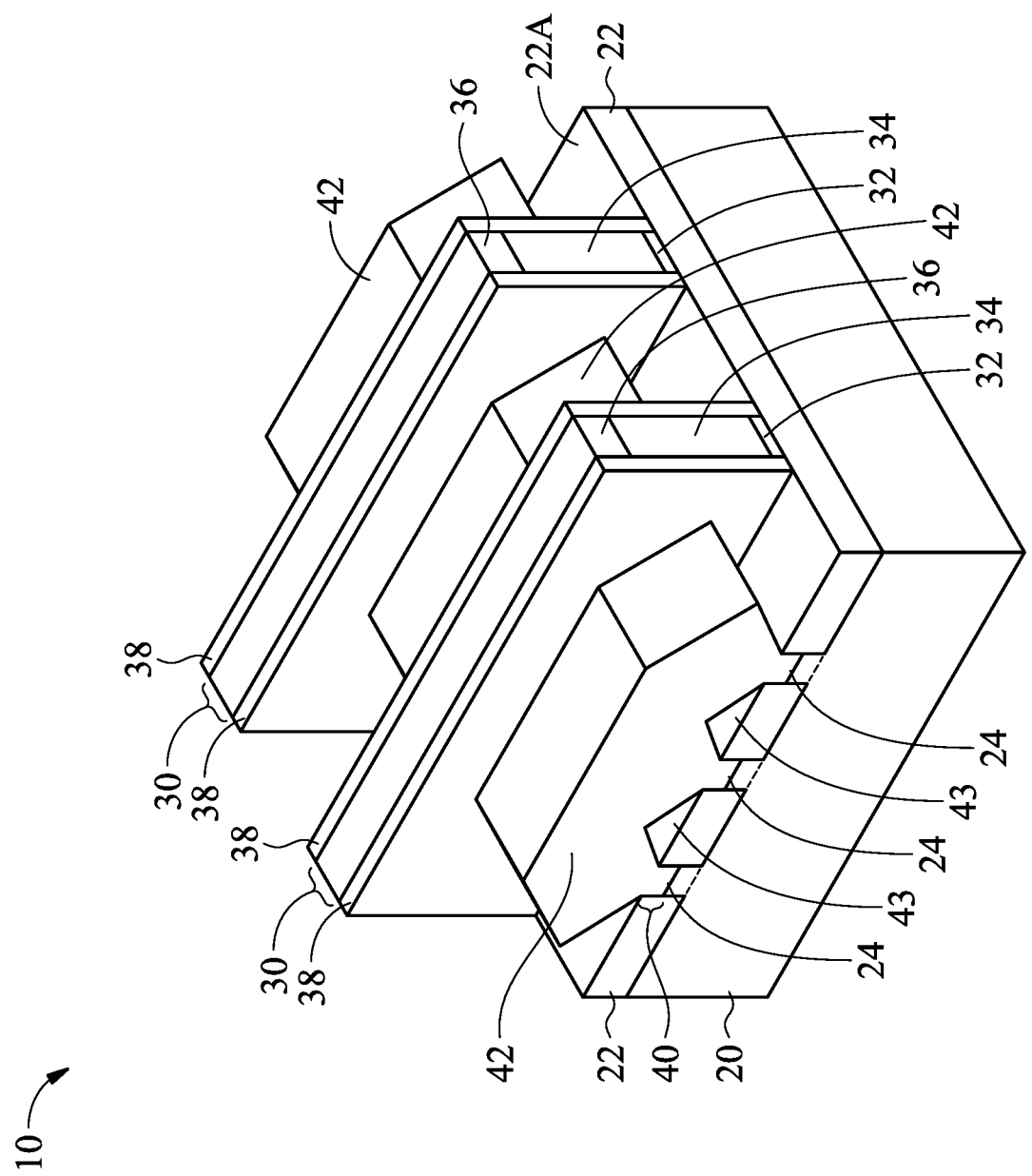

Next, epitaxy regions (source/drain regions) 42 are formed by selectively growing a semiconductor material in recesses 40, resulting in the structure in FIG. 5. The respective process is illustrated as process 206 in the process flow 200 shown in FIG. 19. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fill recesses 40, epitaxy regions 42 start expanding horizontally, and facets may be formed. Air gaps 43 may also be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy.

Figure 6:
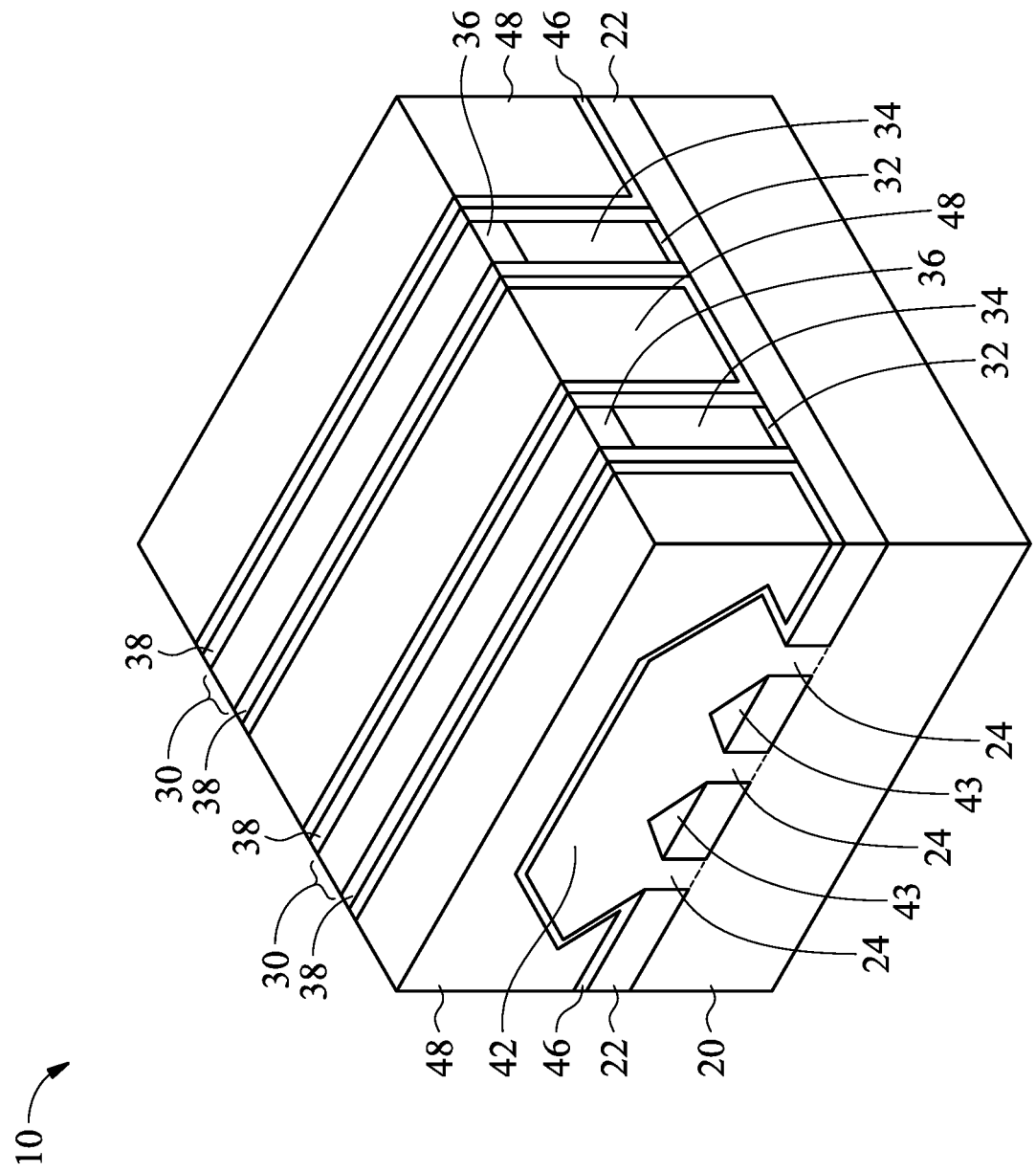

FIG. 6 illustrates a perspective view of the structure after the formation of Contact Etch Stop Layer (CESL) 46 and Inter-Layer Dielectric (ILD) 48. The respective process is illustrated as process 208 in the process flow 200 shown in FIG. 19. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be a silicon-oxide based oxide such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 7:
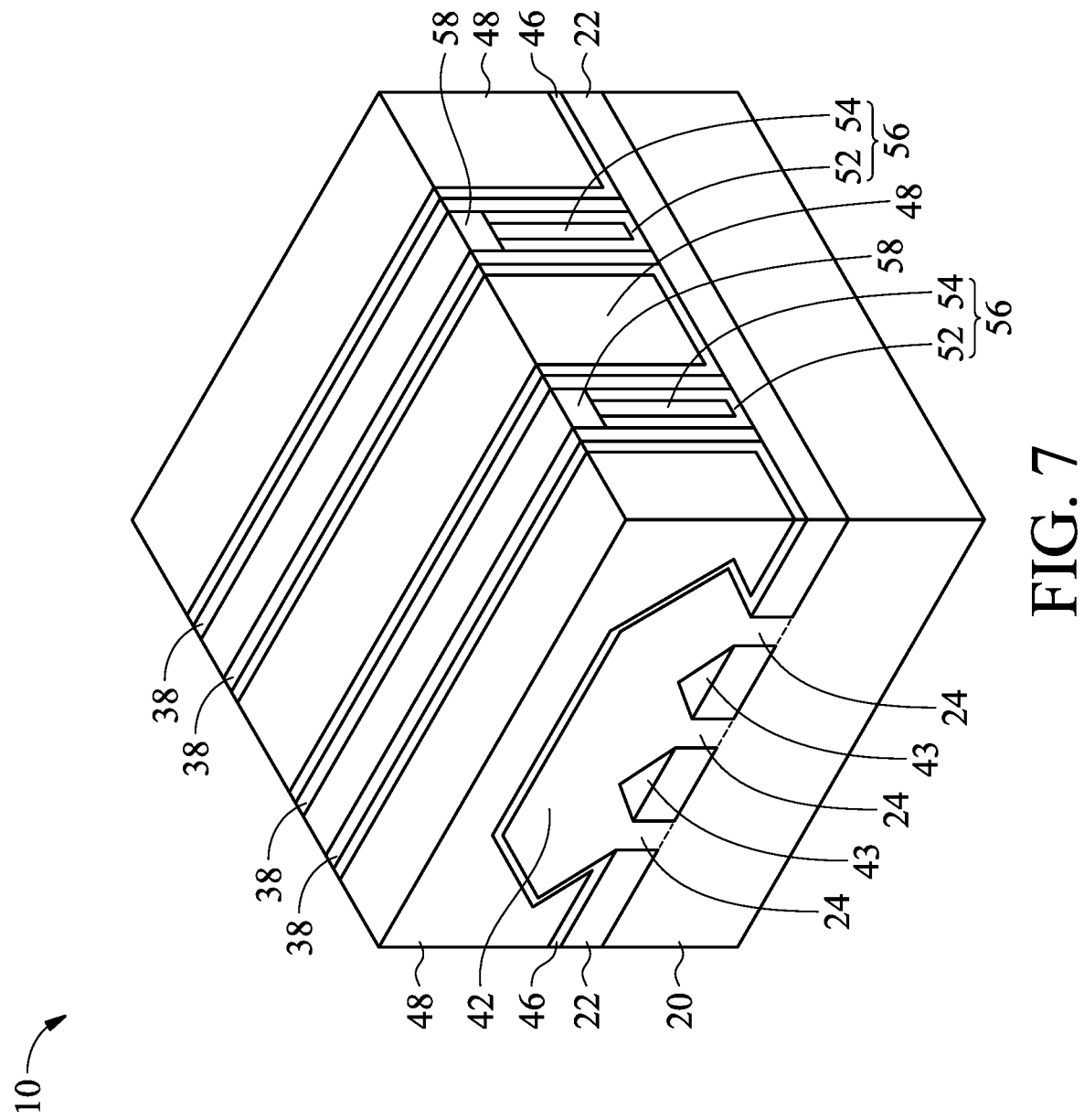

Next, dummy gate stacks 30, which include hard mask layers 36, dummy gate electrodes 34, and dummy gate dielectrics 32, are replaced with replacement gate stacks 56. The respective process is illustrated as process 210 in the process 200 shown in FIG. 19. Replacement gate stacks 56 include metal gates 54 and gate dielectrics 52 as shown in FIG. 7. When forming replacement gate stacks 56, hard mask layers 36, dummy gate electrodes 34, and dummy gate dielectrics 32 as shown in FIG. 7 are first removed in one or a plurality of etching steps, resulting in trenches/openings to be formed between gate spacers 38. The top surfaces and the sidewalls of protruding semiconductor fins 24' are exposed to the resulting trenches.

Next, (replacement) gate dielectric layers 52 are formed, which extend into the trenches between gate spacers 38. In accordance with some embodiments of the present disclosure, each of gate dielectric layers 52 include an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 7, gate electrodes 54 are formed over gate dielectrics 52, Gate electrodes 54 include conductive sub-layers. The sub-layers are not shown separately, while the sub-layers may be distinguishable from each other. The deposition of the sub-layers may be performed using conformal deposition methods such as ALD or CVD.

The stacked conductive sub-layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

The deposited gate dielectric layers and conductive layers are formed as conformal layers extending into the trenches, and include some portions over ILD 48. Next, a metallic material is deposited to fill the remaining trenches between gate spacers 38. The metallic material may be formed of tungsten or cobalt, for example. In a subsequent step, a planarization step such as a CMP process or a mechanical grinding process is performed, so that the portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, CESL 46, and ILD 48 may be substantially coplanar at this time.

FIG. 7 also illustrates the formation of hard masks 58 in accordance with some embodiments. The respective process is also illustrated as process 210 in the process flow 200 shown in FIG. 19. The formation of hard mask 58 may include performing an etching step to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxynitride, silicon oxy-carbo-nitride, or the like.

Figure 8:
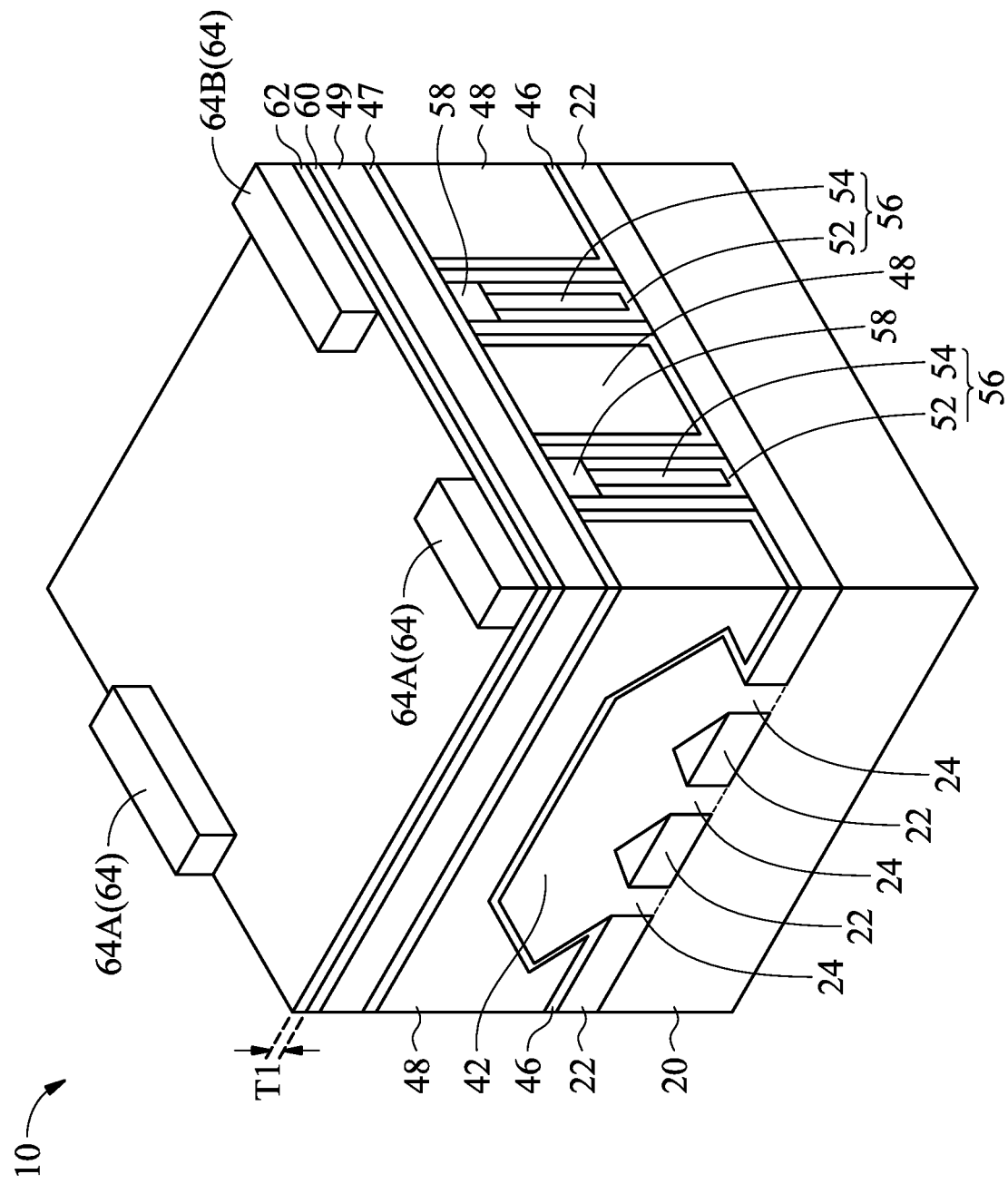

Next, referring to FIG. 8, etch stop layer 47 and a second ILD 49 are deposited over ILD 48. The respective process is illustrated as process 212 in the process flow 200 shown in FIG. 19. In accordance with some embodiments, etch stop layer 47 is a dielectric layer formed of, for example, silicon carbide, silicon nitride, silicon oxide, or the like. ILD 49 may be formed of a material selected from the same group of candidate materials for forming ILD 48.

Next, referring to FIG. 8, hard mask layers 60 and 62 are formed over ILD 48. The respective process is illustrated as process 214 in the process flow 200 shown in FIG. 19. In accordance with some embodiments of the present disclosure, hard mask layer 60 is a metal-containing hard mask layer, which may be formed of titanium nitride, tungsten carbide, or the like. Hard mask layer 60 may have a thickness in the range between about 150 Å and about 400 Å. Hard mask layer 62 may be an oxide layer, which may be a Low-Temperature (LT) oxide layer deposited at a low temperature, for example, lower than about 100° C. Hard mask layer 62 may have a thickness T1 in the range between about 300 Å and about 600 Å.

Etching masks 64A and 64B are formed over hard mask layer 62. The respective process is illustrated as process 216 in the process flow 200 shown in FIG. 19. Etching masks 64A and 64B are also individually and collectively referred to as etching masks 64. The thickness of etching masks 64 may be between about 100 Å and about 300 Å. Etching masks 64 may be formed of amorphous silicon, while other materials having adequate etching selectivity with the underlying layers 60 and 62 may be used. The formation of etching masks 64A and 64B may include depositing a blanket layer, and then patterning the blanket layer. Hard mask layers 60 and 62 and the corresponding layer from which etching masks 64 are formed may be deposited using Chemical Vapor Deposition (CVD), Atomic Layer Deposition (ALD), or the like.

Figure 9A:
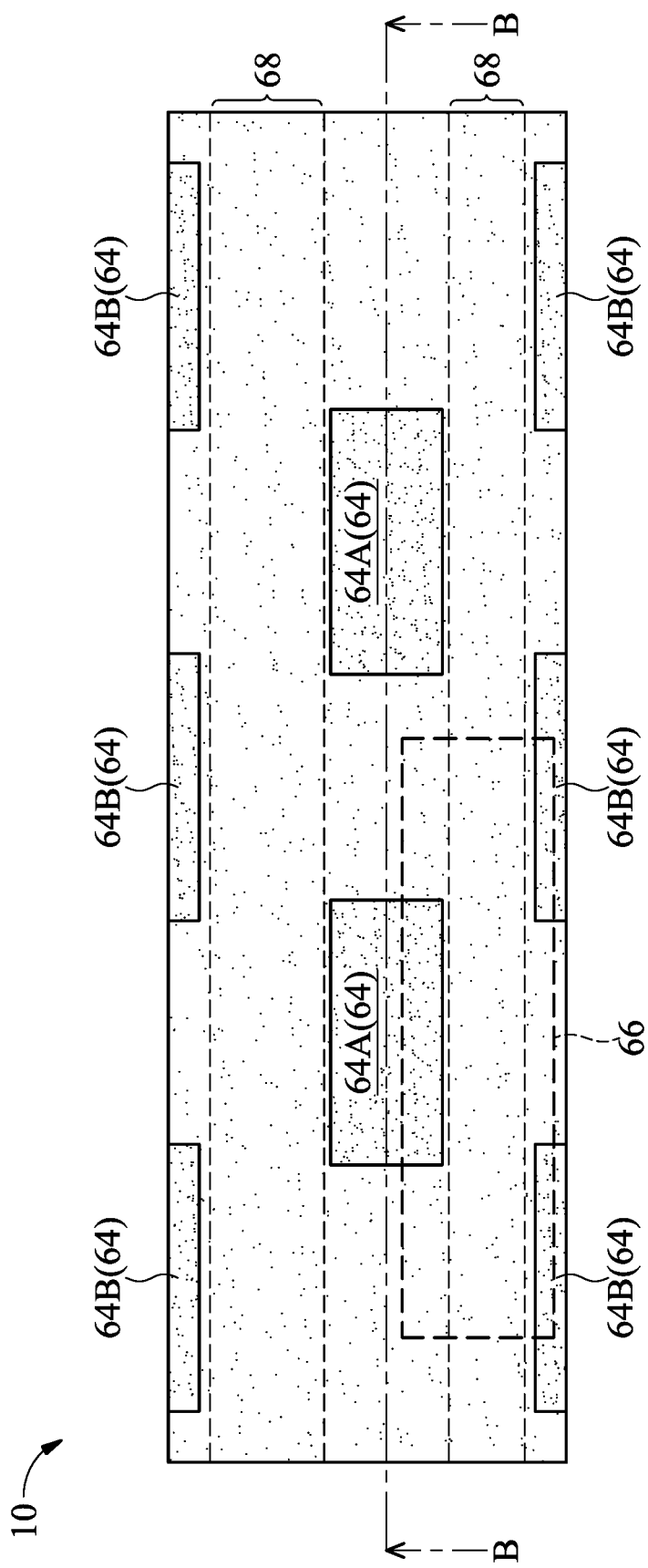
Figure 9B:
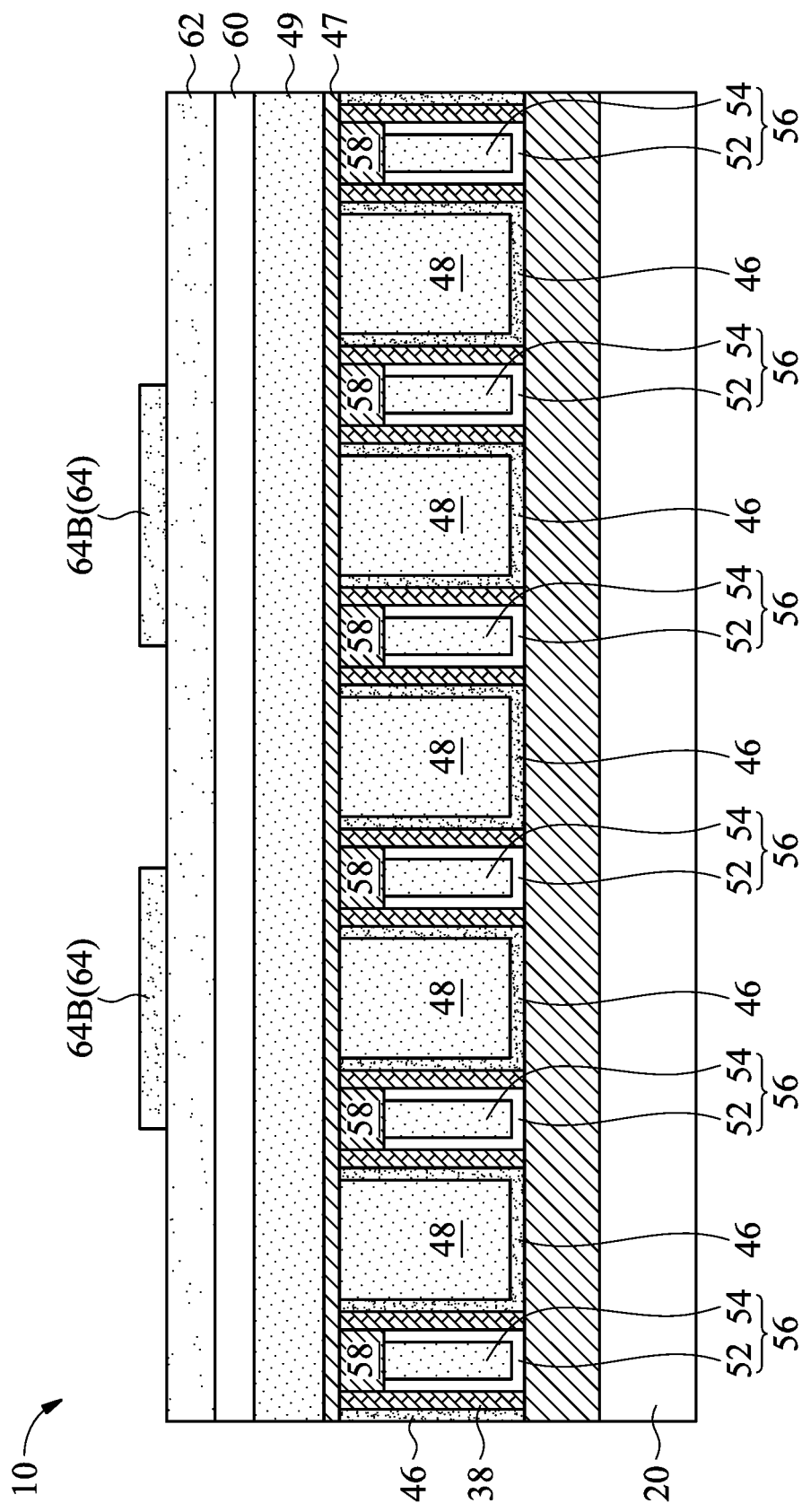

FIG. 9A illustrates a top view of a portion of wafer 10. The structure shown in FIG. 8 illustrates the portion 66 of wafer 10 as in FIG. 9A. In FIG. 9A, gate stacks 56, hard masks 58, and gate spacers 38 are illustrated as parallel strips in accordance with some embodiments. The source and drain regions 42 (not shown) may be formed in the regions marked as 68 and between gate spacers 38. Etching masks 64A and 64B may be in alternating rows. Etching masks 64A and 64B may have different lengths, with some longer than that are shown in FIG. 9A. For example, some etching masks 64 may extend across three or more gate stacks. FIG. 9B illustrates a cross-sectional view of the structure shown in FIG. 9A, wherein the cross-sectional view is obtained from the vertical plane containing line B-B in FIG. 9A. The subsequent cross-sectional views in subsequent figures whose figure numbers have the letter "B,", unless specified otherwise, are also obtained from the same plane as the vertical plane containing line B-B in the corresponding top views.

Figure 10A:
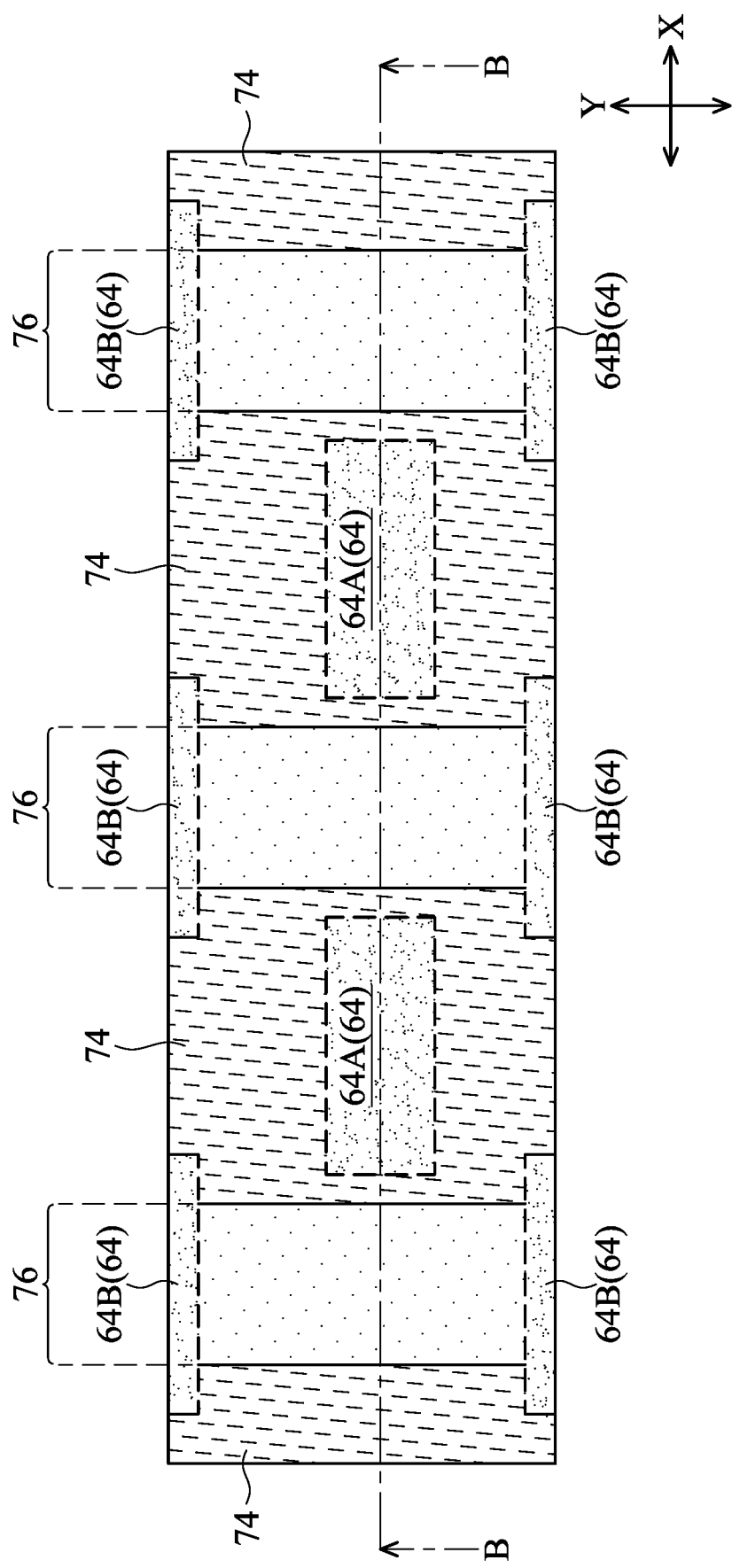
Figure 10B:
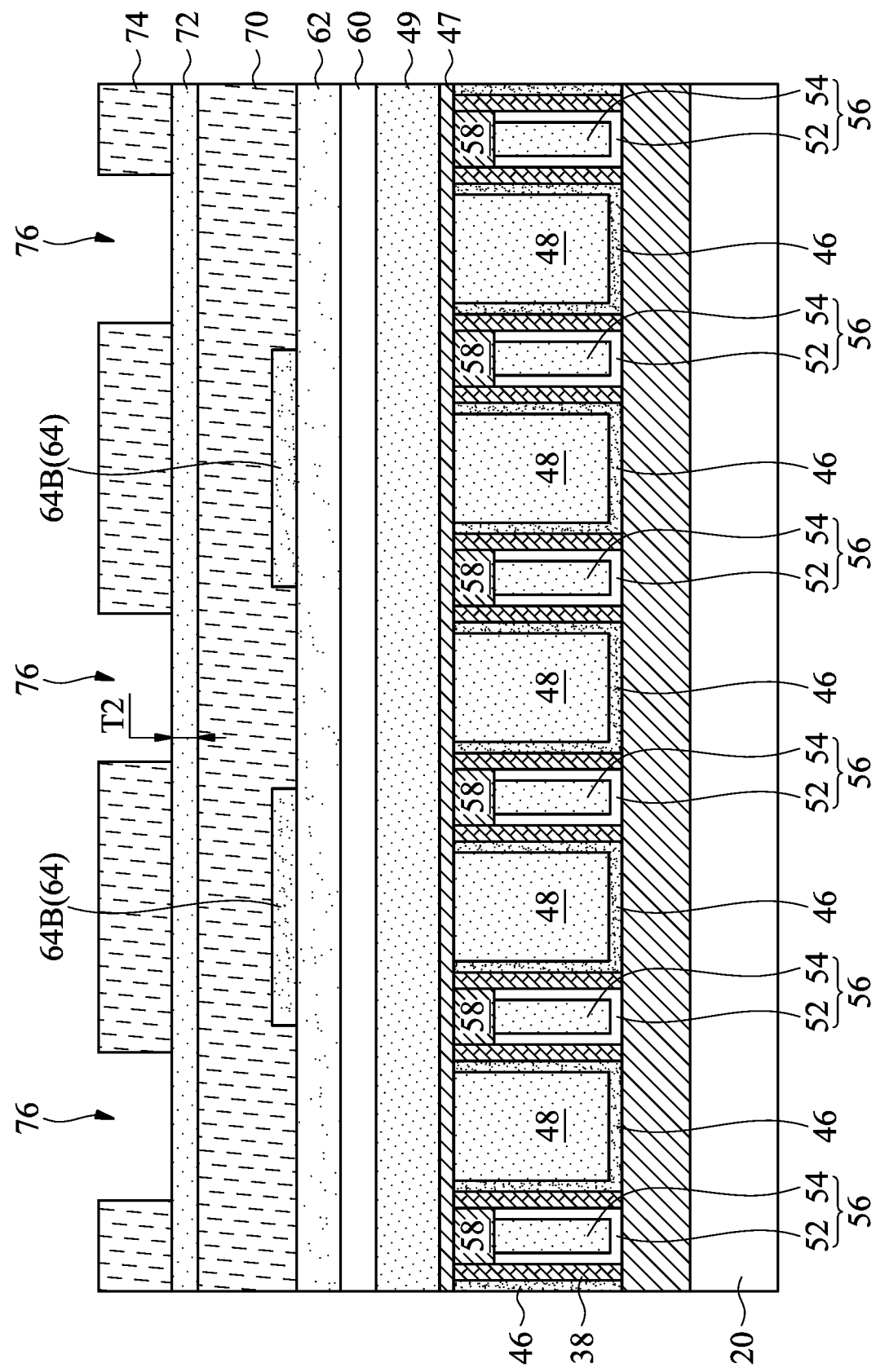

FIGS. 10A, 10B, 11, 12, 13A/13B, and 14A/14B illustrate a first pattern-formation process for forming the patterns of some contact plugs in hard mask layer 62. The respective process is illustrated as process 218 in the process flow 200 shown in FIG. 19. Accordingly, layer 62 is referred to as a pattern-reservation layer throughout the description. Referring to FIG. 10B, a tri-layer including bottom layer 70, middle layer 72, and upper layer 74 is formed to cover etching masks 64. Upper layer 74 is patterned in a lithography process to form openings 76. FIG. 10A illustrates a top view of upper layer 74 and openings 76. Openings 76 are formed as strips overlapping some portions of etching masks 64B. In accordance with some embodiments, openings 76 have lengthwise directions parallel to the Y direction, and each of openings 76 may cross over the middle portions of a plurality of etching masks 64B.

In accordance with some embodiments, upper layer 74 is formed of photo resist, and bottom layer 70 (FIG. 10B) may be formed of a photo resist or other type of $Si_xO_yC_z$ based material. Middle layer 72 may be formed of, for example, a silicon-containing material such as silicon oxynitride (SiON) or the like. The thickness T2 of middle layer 72 may be in the range between about 200 Å and about 500 Å.

Figure 11:
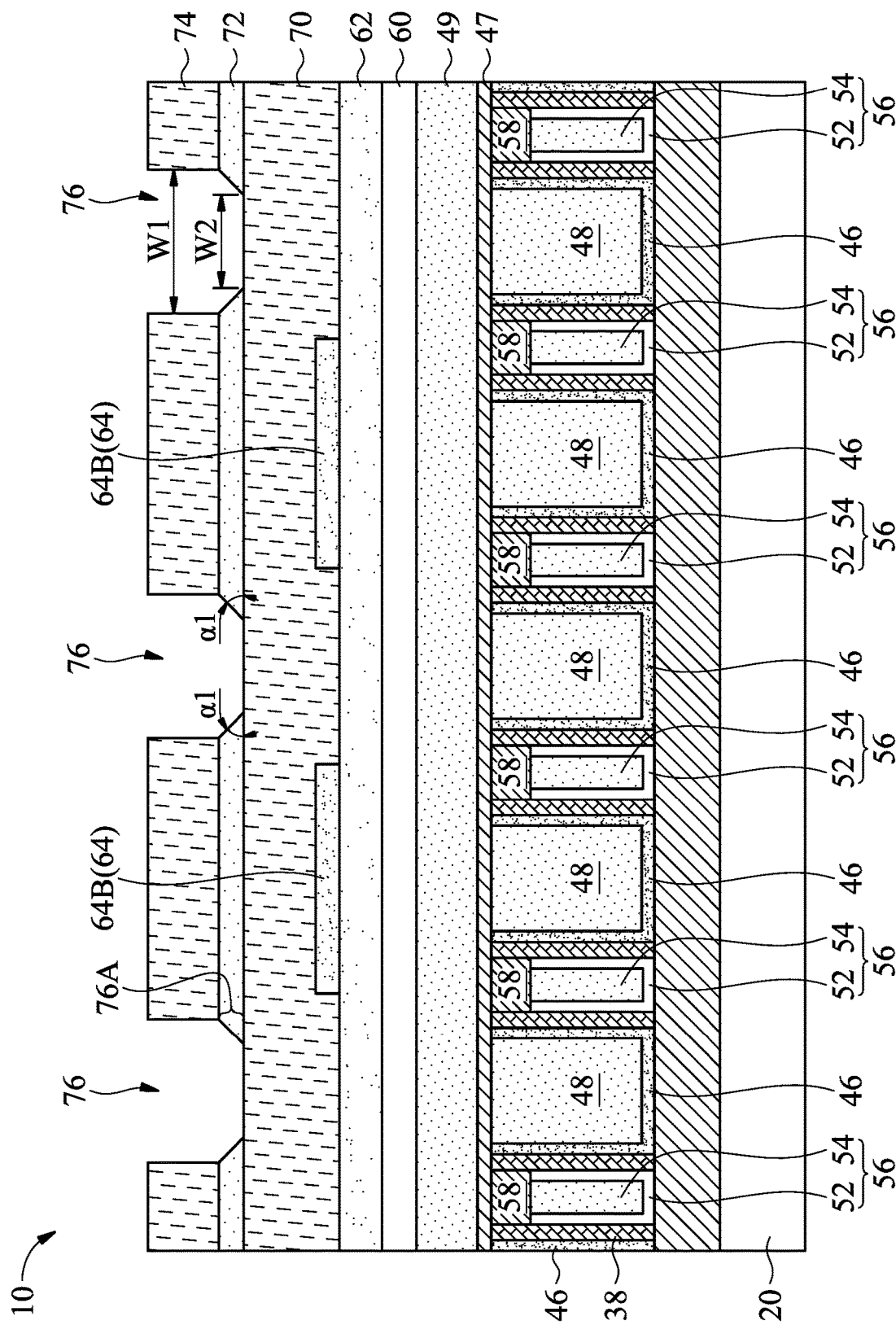

Referring to FIG. 11, middle layer 72 is etched using the patterned upper layer 74 as an etching mask, so that openings 76 extend into middle layer 72. The portions of openings 76 in middle layer 72 are referred to as openings 76A. In accordance with some embodiments, the etching is performed using an anisotropic etching method. The etching method may be selected from Reactive Ion Etching (RIE), which may be implemented using Inductively Coupled Plasma (ICP), Capacitively Coupling Plasma (CCP), or the like. The process gases may include an etching gas(es) and a polymer-forming gas(es). In accordance with some embodiments, the etching gas may include a fluorine-containing gas such as $CF_4$, $NF_3$, or combinations thereof. The polymer-forming gas may include carbon-and-fluorine gases such as $CHF_3$, $CH_2F_2$, $CH_3F$, $C_4F_6$, $C_4F_8$, or combinations thereof. The pressure of the process gases may be in the range between about 5 mTorr and about 200 mTorr. The temperature of wafer 10 during the etching may be in the range between about 0° C. and about 50° C. In the etching process, fluorine (F) reacts with $Si_xO_yC_z$ and the polymer-forming gases (such as $CHF_3$, $CH_2F_2$, $CH_3F$, $C_4F_6$, and/or $C_4F_8$, which are ionized and dissociated as $C_3F+$, $C_2F+$, CF+3, CF+2, CF+, C4F− etc.), so that polymer $C_xF_yH_z$ is generated as a passivation layer on the sidewall of the respective opening 76A.

The etching process conditions such as the type and the flow rates of the process gases are adjusted, so that the sidewalls of openings 76A are slanted. For example, when more polymer-forming gases are conducted, the sidewalls of openings 76A are more tilted, and vice versa since the formed polymer protects the sidewalls of the middle layer 72, causing the opening size to be smaller and smaller with the proceeding of the etching. The tilt angle α1 of the sidewalls of openings 76A may be smaller than about 89 degrees, and may be in the range between about 85 degrees and about 30 degrees. The appropriate tilt angle α1 thus may be achieved by providing an appropriate flow rate ratio, which is the flow rate of the etching gas to the flow rate of the polymer-forming gas. As a result, the bottom widths W2 of openings 76A are smaller than the respective top widths W1 of openings 76A. The tilt angle α1 is affected by the ratio of the polymer-forming gas to the etching gas. For example, with more polymer-forming gas added, tilt angle α1 becomes smaller. With less polymer-forming gas added, tilt angle α1 becomes greater, and may eventually be greater than 90 degrees if no polymer-forming gas is added. It is desirable that bottom widths W2 are smaller than top widths W1, so that the widths of the subsequently formed contact openings (FIG. 17B) are reduced to be smaller than width W1. For example, the minimum width of openings 76 in upper layer 74 is limited by the capability of the lithography process. Accordingly, it is desired that width difference (W1−W2) is significant enough (e.g., greater than about 12 nm) so that the subsequently formed contact openings may have significantly reduced widths. Width difference (W1−W2), however, cannot be too big (e.g., greater than about 20 nm) since this will result in process difficulty and possibly yield loss due to pattern-loading effect. In accordance with some embodiments of the present disclosure, width difference (W1−W2) is in the range between about 12 nm and about 20 nm. In accordance with some embodiments, width difference (W1−W2) is adjusted through adjusting the flow-rate ratio of the flow rate $FR_{PF1}/FR_{EG1}$, wherein $FR_{PF1}$ is the flow rate of the polymer-forming gas, and $FR_{EG1}$ is the flow rate of the etching gas. In accordance with some embodiments, the flow-rate ratio rate $FR_{PF1}/FR_{EG1}$ is in the range between about 0.5 and about 3.0. Also, since the sidewalls of openings 76A are tilted, width difference (W1−W2) may also be adjusted by selecting an appropriate thickness T2 of middle layer 72.

Figure 12:
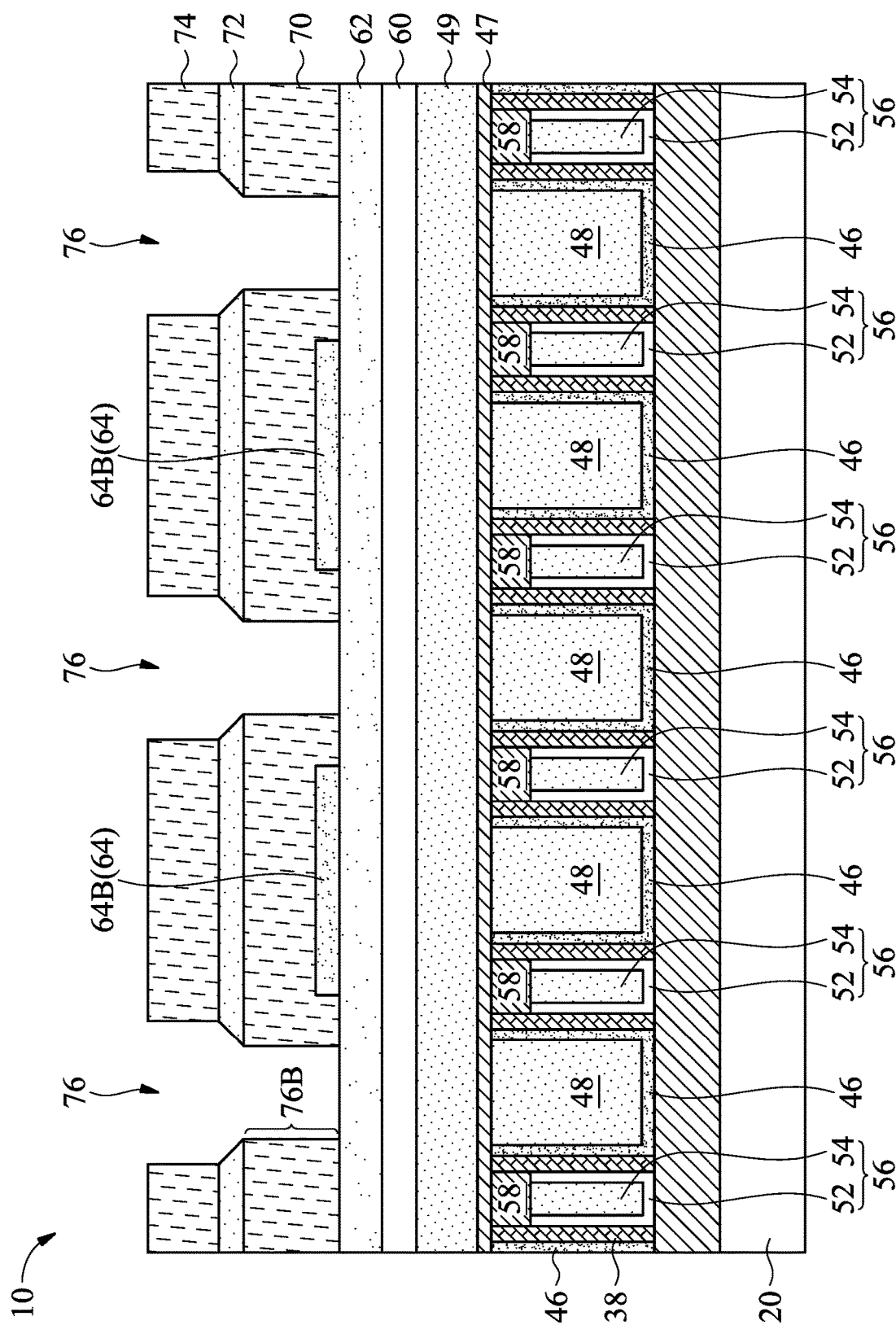

FIG. 12 illustrates the etching of bottom layer 70, so that openings 76 further extend into bottom layer 70. The portions of openings 76 in bottom layer 70 are referred to as openings 76B. Hard mask layer 62 is thus exposed. Also, etching masks 64A (FIG. 13A) are also exposed to openings 76/76B. Openings 76B may have substantially vertical sidewalls. In accordance with some embodiments, bottom layer 70 comprises $C_xH_yO_z$. The respective etching gas may include oxygen ($O_2$), and the polymer-forming gas may include $SO_2$. Oxygen atoms (O) react with sulfur atoms (S) to form sulfur-containing byproducts, which act as a sidewall passivation layer on the sidewalls of openings 76B. By selecting an appropriate flow rate ratio, which is the flow rate of the etching gas to the flow rate of the polymer-forming gas, vertical sidewalls may be achieved.

Figure 13A:
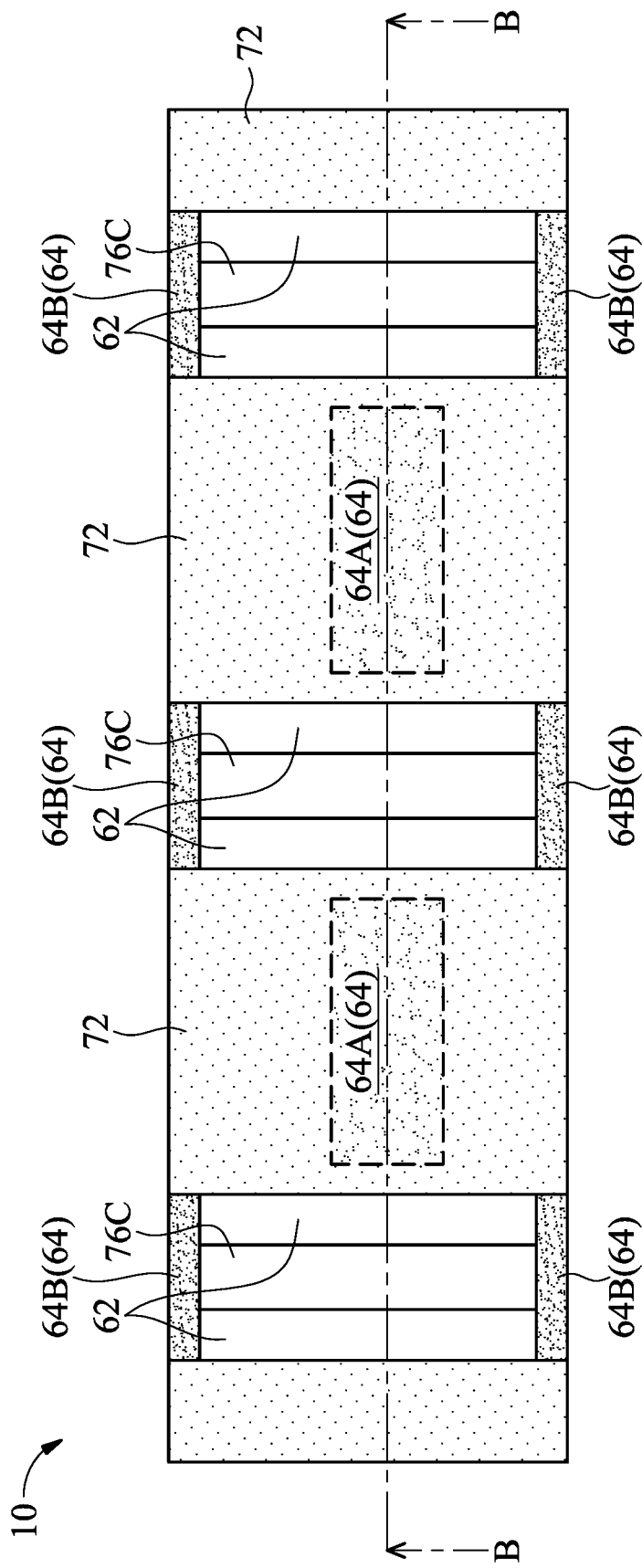
Figure 13B:
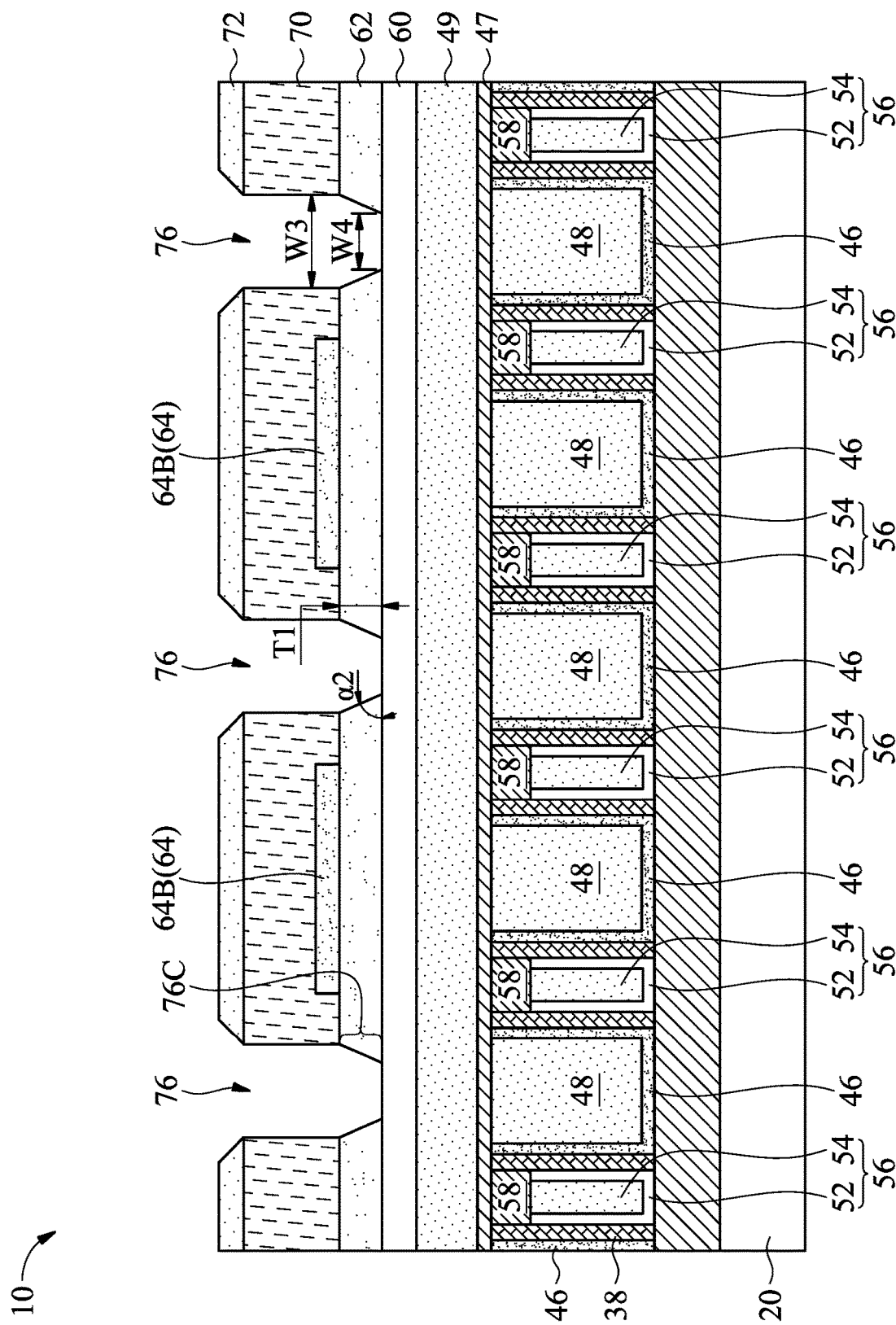

Next, referring to FIGS. 13A and 13B, hard mask layer 62 is etched using the remaining tri-layer as an etching mask, and openings 76 extend into hard mask layer 62. The portions of openings 76 in layer 62 are also referred to as openings 76C. Hard mask layer 62 is etched using the patterned middle layer 72 (if remaining) and bottom layer 70 as an etching mask. As shown in FIG. 13A, when hard mask layer 62 is etched, etching masks 64B act as parts of the etching mask, so that openings 76C are limited between the exposed portions of etching masks 64B. In accordance with some embodiments, the etching is performed using an anisotropic etching method. The Etching method may be selected from RIE (such as ICP or CCP), or the like. The process gases may include an etching gas(es) and a polymer-forming gas(es). In accordance with some embodiments, for example, when hard mask layer 62 comprises silicon oxide, the etching gas may include a fluorine-containing gas such as $CF_4$, $NF_3$, or combinations thereof. The polymer-forming gas may include $CHF_3$, $CH_2F_2$, $CH_3F$, $C_4F_6$, $C_4F_8$, or combinations thereof. The pressure of the process gases may be in the range between about 5 mTorr and about 200 mTorr. The temperature of wafer 10 during the etching may be in the range between about 0° C. and about 50° C.

The etching process conditions such as the type and the flow rates of the process gas are also adjusted, so that the sidewalls of openings 76C are tilted. The tilt angle α2 of the sidewalls of openings 76C may be smaller than about 89 degrees, and may be in the range between about 85 degrees and about 30 degrees. By selecting an appropriate flow rate ratio, which is the flow rate of the etching gas to the flow rate of the polymer-forming gas, the desirable tilting angle α2 may be achieved. As a result, the bottom widths W4 of openings 76C are smaller than the respective top widths W3 of openings 76C, wherein widths W3 may be close to widths W2 (FIG. 11). It is desirable that bottom widths W4 are smaller than top widths W3, so that the widths of the subsequently formed contact openings (FIG. 17B) are further reduced than the width W3. Width differences (W1−W2) (FIG. 11) and (W3−W4) (FIG. 13B) in combination contribute to the overall shrinking of the sizes of the resulting contact openings, without the need of having either one of the differences (W1−W2) and (W3−W4) to be big enough to incur process problems. Accordingly, (W3−W4) is not too big and not too small. In accordance with some embodiments of the present disclosure, width difference (W3−W4) is in the range between about 12 nm and about 20 nm. In accordance with some embodiments, width difference (W3−W4) is adjusted through adjusting the flow-rate ratio of the flow rate $FR_{PF2}/FR_{EG2}$, wherein $FR_{PF2}$ is the flow rate of the polymer-forming gas, and $FR_{EG2}$ is the flow rate of the etching gas. In accordance with some embodiments, the flow-rate ratio rate $FR_{PF2}/FR_{EG2}$ is in the range between about 0.5 and about 3. In addition, width difference (W1−W2) is adjusted by selecting an appropriate thickness T1 for hard mask layer 62.

Figure 14A:
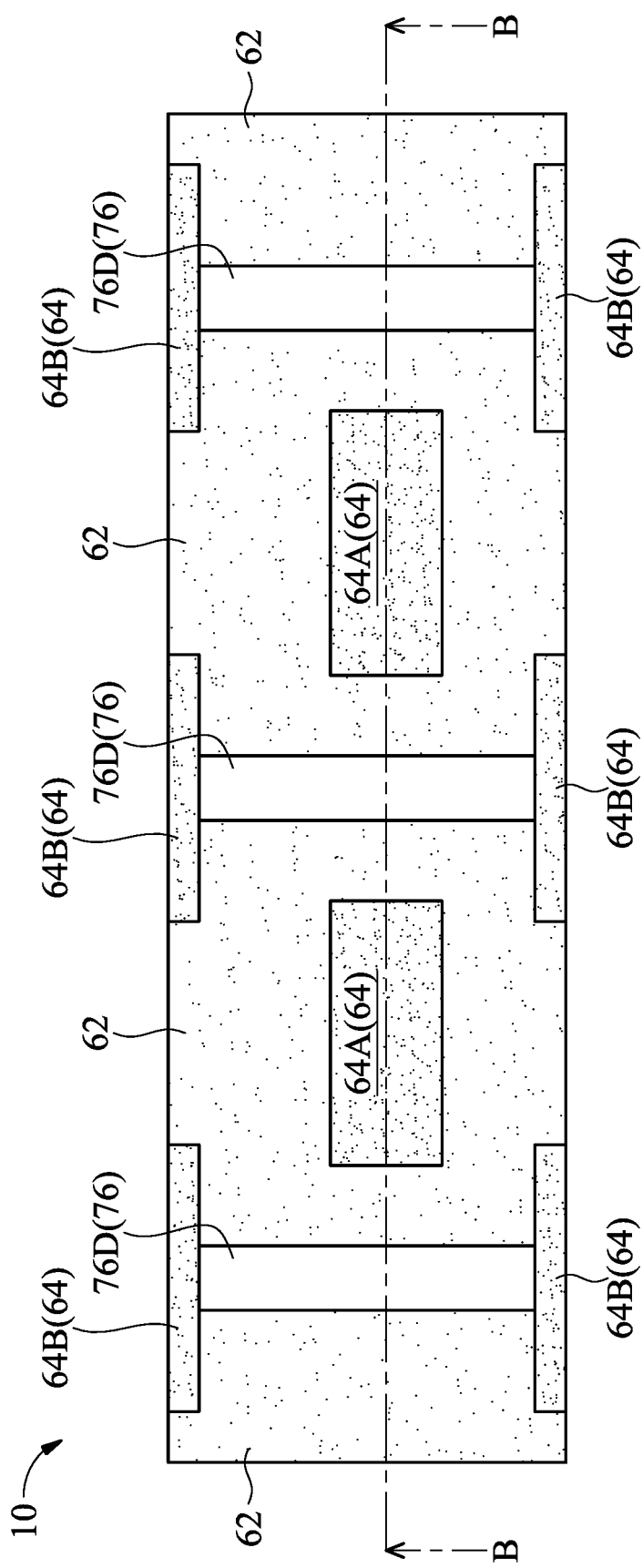
Figure 14B:
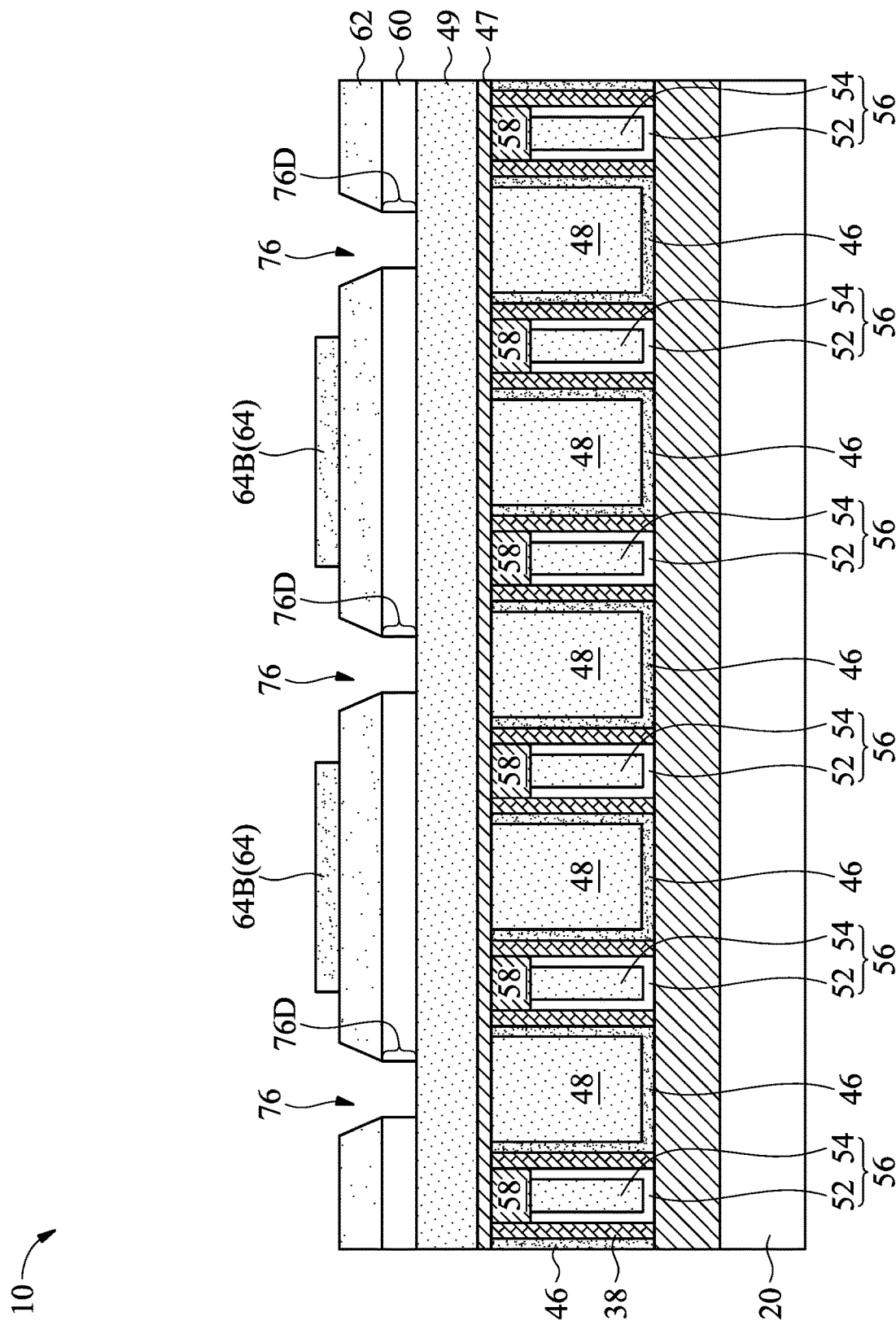

After the etching of hard mask layer 62, middle layer 72 has been removed, and the remaining bottom layer 70 is removed, for example, in an ashing process, which may be performed using ozone ($O_3$) or a chemical solution comprising $NH_4OH$, $H_2O_2$, and $H_2O$ (sometimes referred to as Standard Clean 1 (SC1) solution). FIGS. 14A and 14B illustrate a top view and a cross-sectional view, respectively, of the resulting structure.

As also shown in FIGS. 14A and 14B, hard masks 64B and hard mask layer 62 are in combination used as an etching mask to etch hard mask layer 60, so that openings 76 further extend into hard mask layer 60. The portions of openings 76 in bottom layer 70 are referred to as openings 76D. ILD 49 is thus exposed. Openings 76D may have substantially vertical sidewalls. In accordance with some embodiments, the etching conditions for etching hard mask layer 60 are adjusted so that the sidewalls of openings 76D are vertical.

The etching method of hard mask 60 may be selected from RIE such as ICP, CCP, or the like. The process gases may include an etching gas(es) and a polymer-forming gas(es). In accordance with some embodiments, for example, when hard mask layer 60 comprises tungsten carbide, the etching gas may include a fluorine-containing gas such as $CF_4$, $NF_3$, or combinations thereof. The polymer-forming gas may include $Cl_2$, $O_2$, or combinations thereof. The pressure of the process gases may be in the range between about 5 mTorr and about 200 mTorr. By selecting an appropriate flow ratio, which is the flow rate of the etching gas to the flow rate of the polymer-forming gas, vertical sidewalls may be achieved. The temperature of wafer 10 during the etching may be in the range between about 0° C. and about 50° C.

In accordance with some embodiments, the materials of middle layer 72 (FIG. 11) and hard mask layer 62 (FIG. 13B) are formed of materials that makes it easy for adjusting the formation of polymers. Accordingly, the shrinking of openings is mainly achieved in layers 62 and 72. The materials of bottom layer 72 (FIG. 12) and hard mask layer 60 (FIG. 14B) are formed of materials making it less easy for adjusting the formation of polymers. Accordingly, the sidewalls of the openings in layers 72 and 60 are made vertical to improve process control.

Figure 15A:
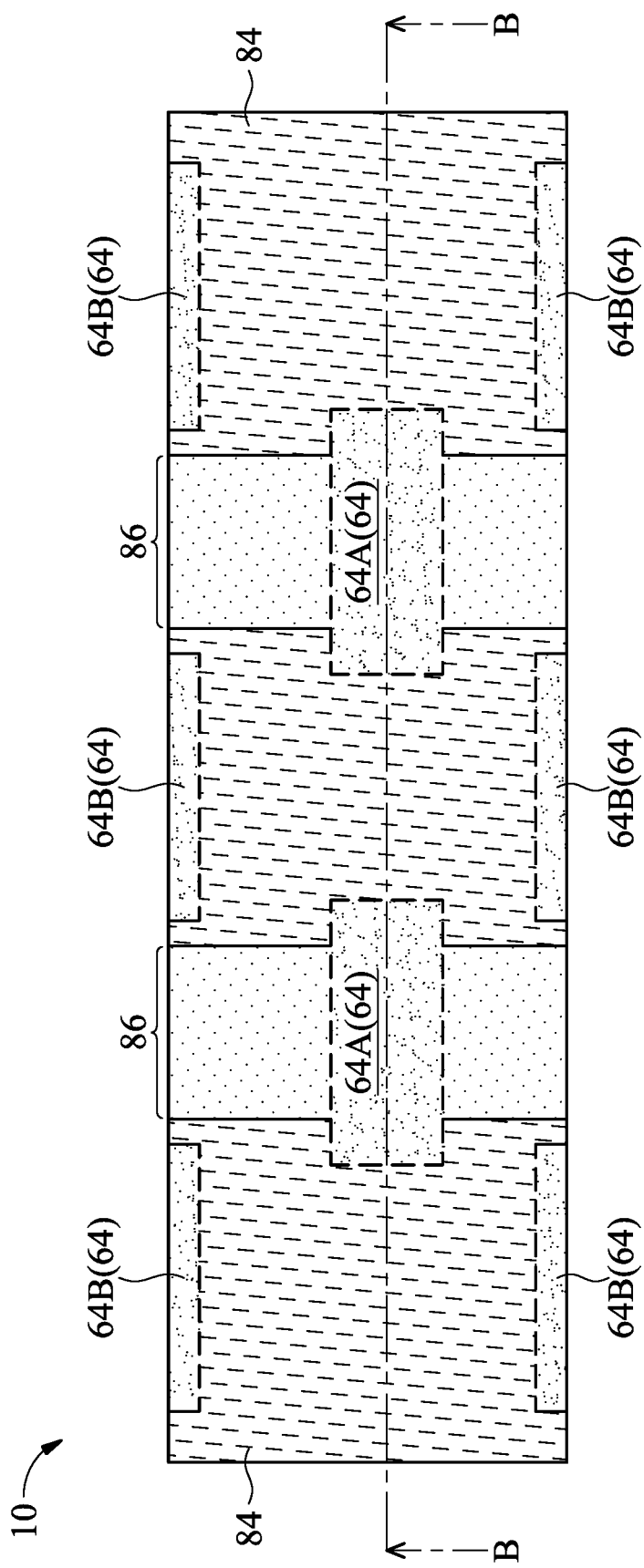
Figure 15B:
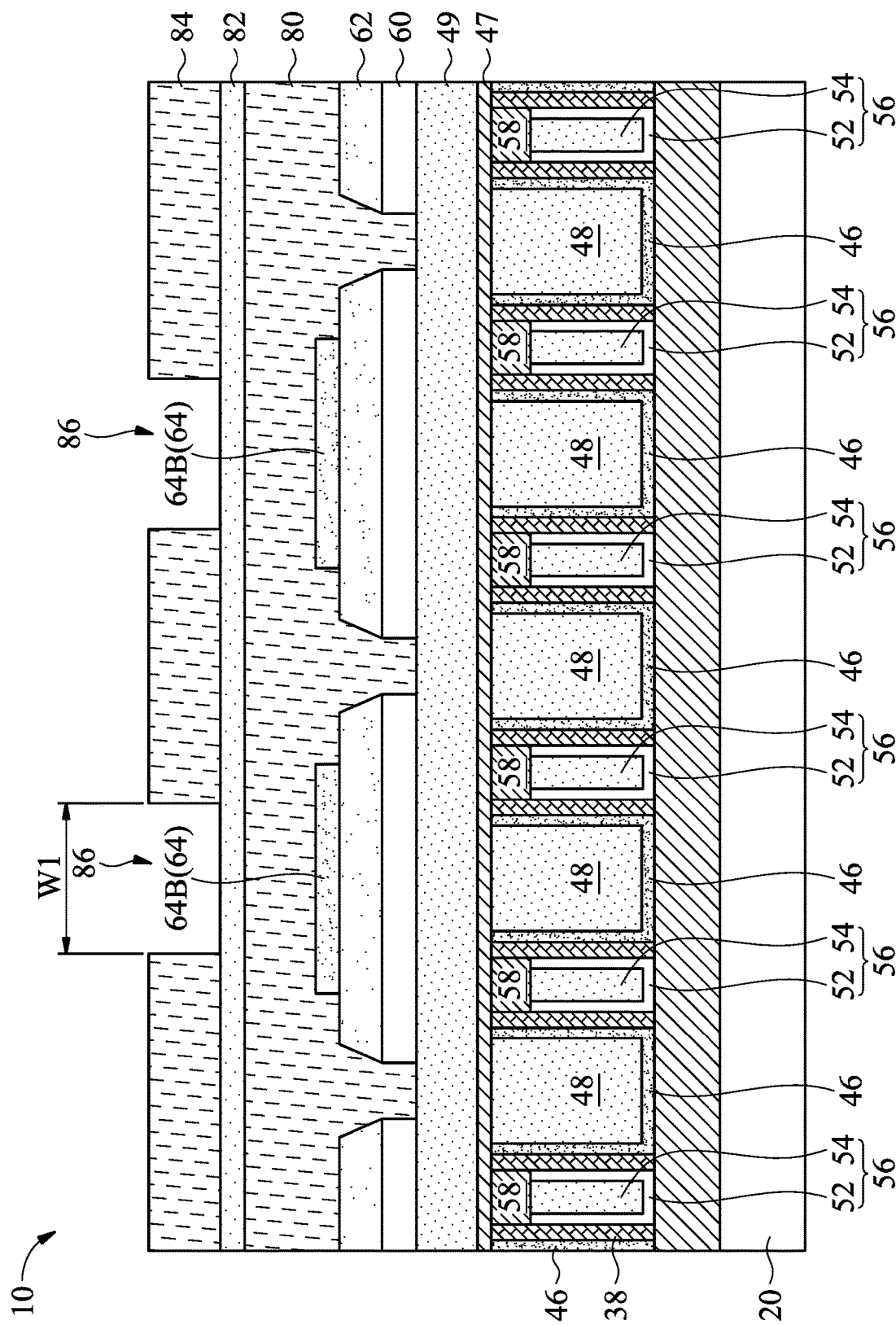
Figure 16A:
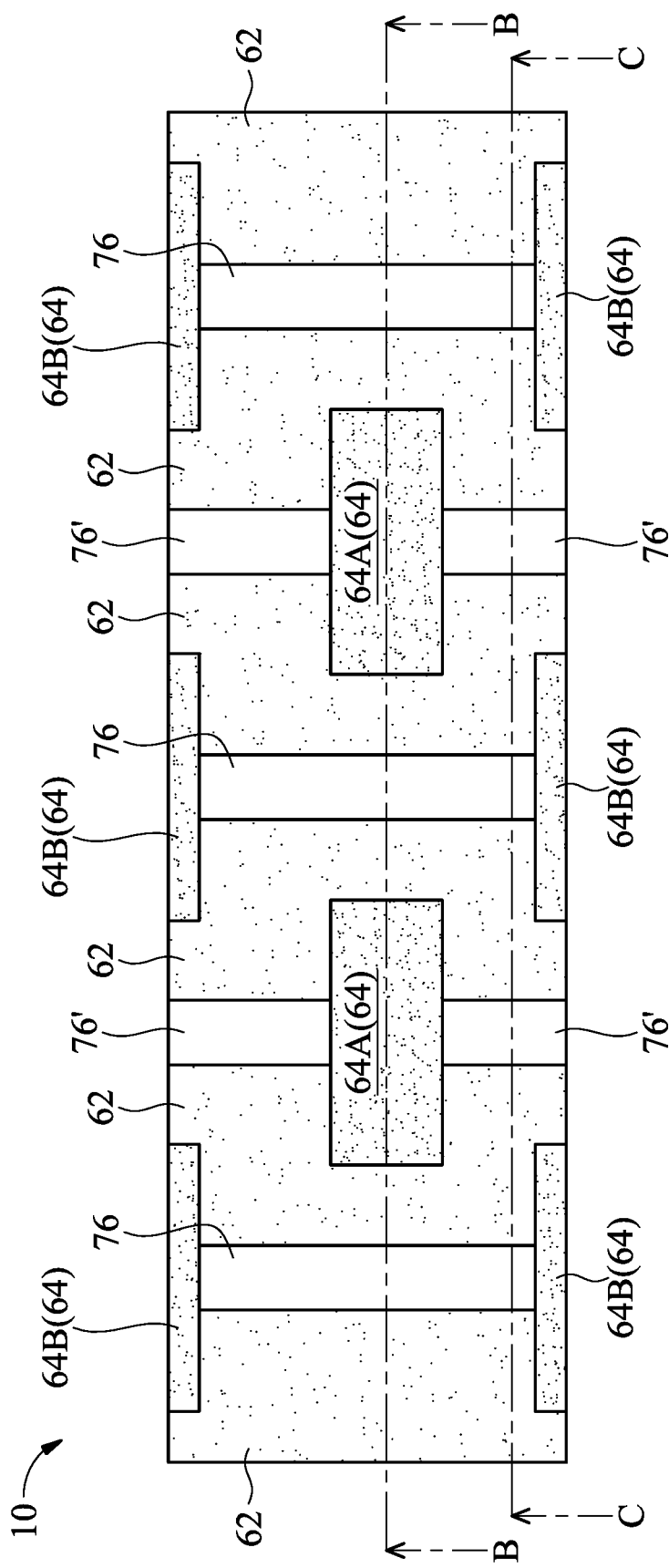
Figure 16B:
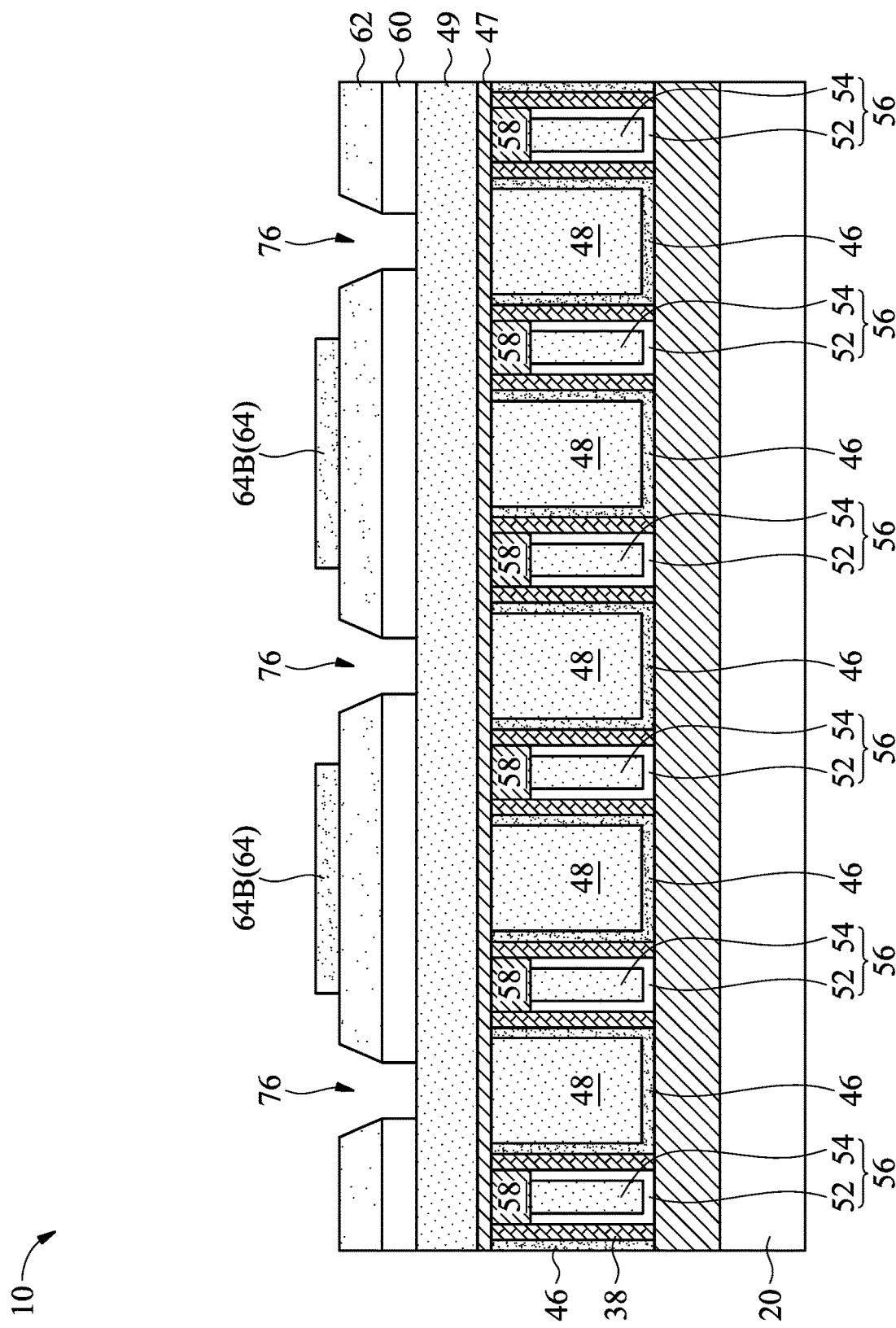
Figure 16C:
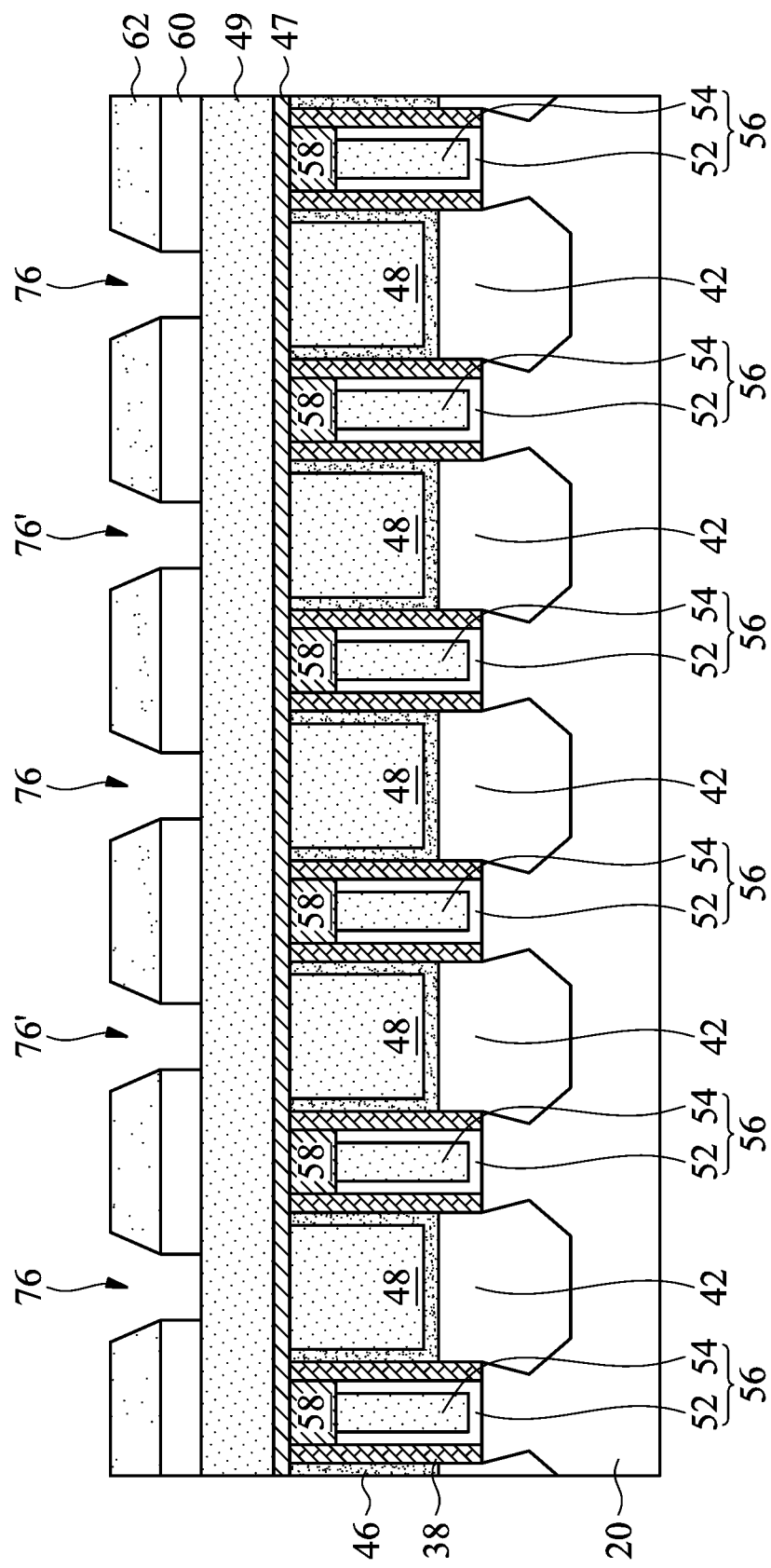

FIGS. 10A/10B through 14A/14B illustrate the first patterning process in a double-patterning process for patterning hard mask layers 62 and 60. FIGS. 15A, 15B, 16A, and 16B illustrate a second patterning process in the double-patterning process for patterning hard mask layers 62 and 60. The respective process is illustrated as process 220 in the process flow 200 shown in FIG. 19. Referring to FIG. 15B, a tri-layer including bottom layer 80, middle layer 82, and upper layer 84 is formed. The materials and thicknesses of layers 80, 82, and 84 may be essentially the same as that of layers 70, 72, and 74 (FIG. 10B), respectively. Upper layer 84 is patterned to form openings 86. As shown in FIGS. 15A and 15B, some portions of etching masks 64A are directly underlying openings 86. The details for the second patterning process are similar to that of the first patterning process as shown in FIGS. 11, 12, 13A, 13B, 14A, and 14B, and hence are not repeated herein. The resulting structures are shown in FIGS. 16A, 16B and 16C. The subsequent cross-sectional views in subsequent figures whose figure numbers have the letter "C," unless specified otherwise, are also obtained from the same plane as the vertical plane containing line C-C in the corresponding top views. As shown in FIG. 16C, openings 76' extend into hard mask layers 62 and 60. Openings 76' have essentially the same widths, which may be equal to width W4 of openings 76.

As shown in FIG. 16B, layer 62 is used to reserve the patterns formed in two patterning processes in the double-patterning process. Furthermore, as is shown in FIG. 16A, etching masks 64 are used to cut the otherwise long openings 76 and 76' into shorter openings, which in turn cuts the otherwise long source/drain contact plugs 92 (FIGS. 18A and 18B) into shorter contact plugs.

FIGS. 11 and 15B illustrate that the widths of opening 76 in upper layer 74 (FIG. 11) and openings 76 in upper layer 84 (FIG. 15B) are W1. Widths W1 may be the minimum width that can be achieved using the respective lithography process (including a light exposure process and a photo development process). Through the processes as shown in FIGS. 11, 12, 13A/13B, and 14A/14B, the widths of openings 76 (and 76') are reduced to W4 (FIG. 16B). The difference (W1−W4) may be in the range between 29 nm and about 37 nm in accordance with some embodiments. If the shrinking of the widths is achieved in a single layer such as the middle layers 72 (FIG. 11) and 82 (FIG. 15B), there may be process problems since achieving such as huge difference may result in significant pattern-loading effect. In accordance with some embodiments of the present disclosure, the shrinkage is shared by more than two layers such as the middle layers in the tri-layers and hard mask layer 62. The process is thus much easier with reduced likelihood of incurring process problems. In accordance with some embodiments of the present disclosure, each of the two layers sharing the shrinkage may share between about ⅓ to about ⅔ of the total shrinkage so that neither of the two layers is responsible for too much shrinkage.

Figure 17A:
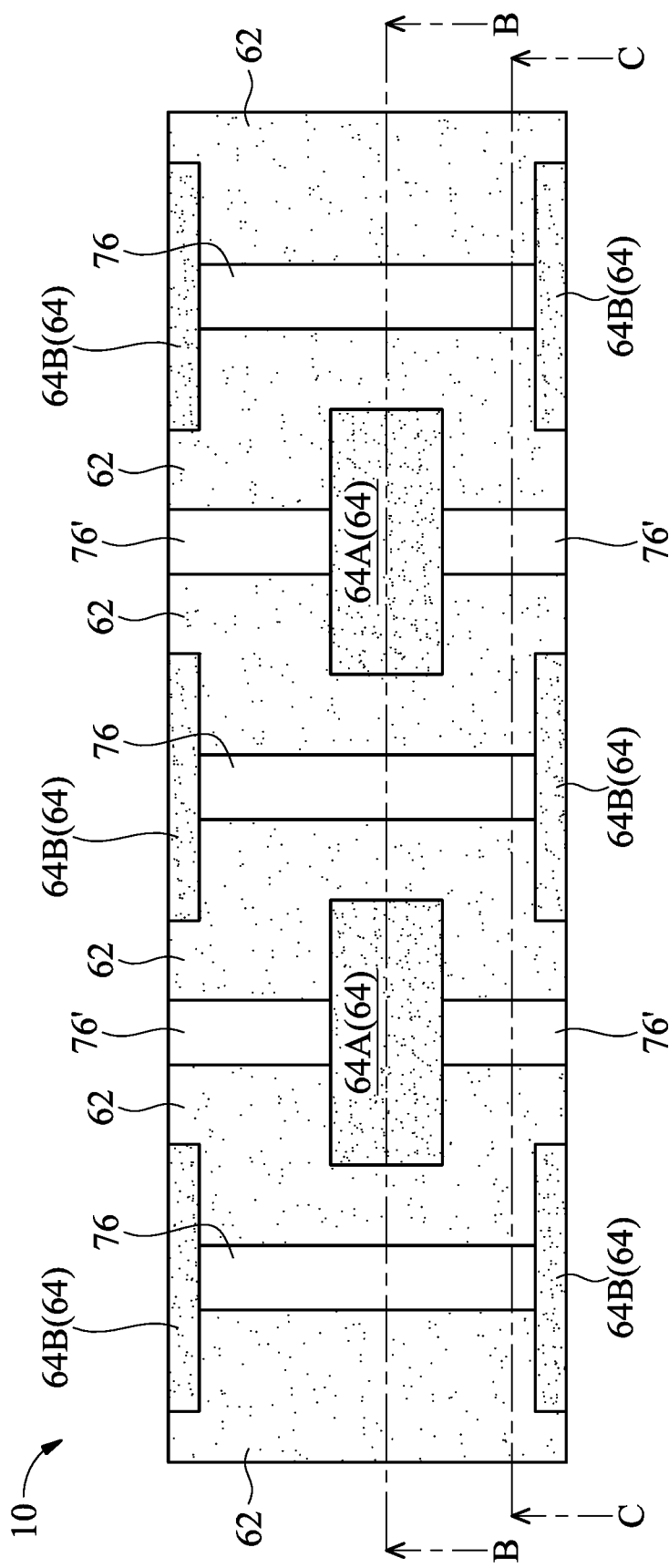
Figure 17B:
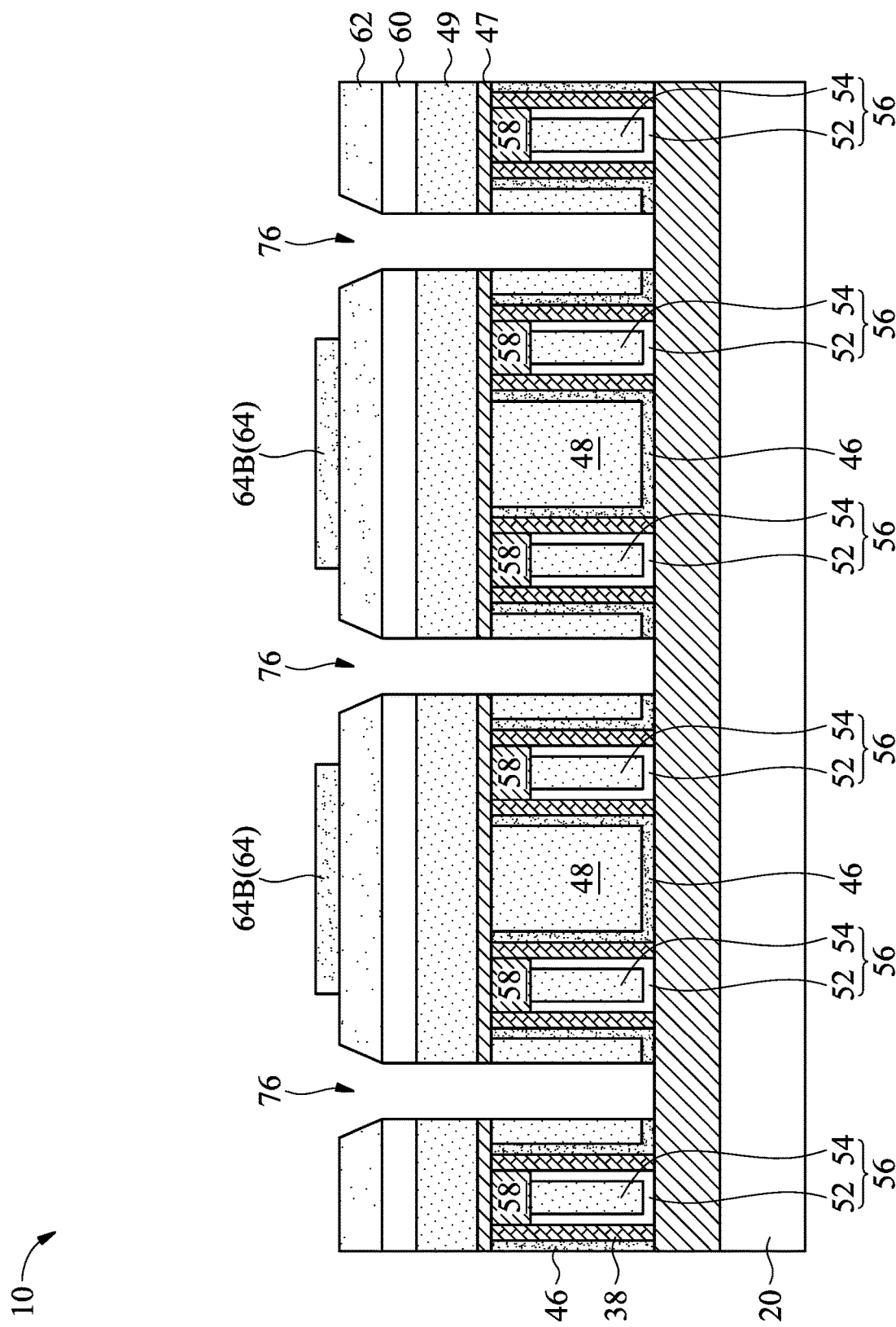
Figure 17C:
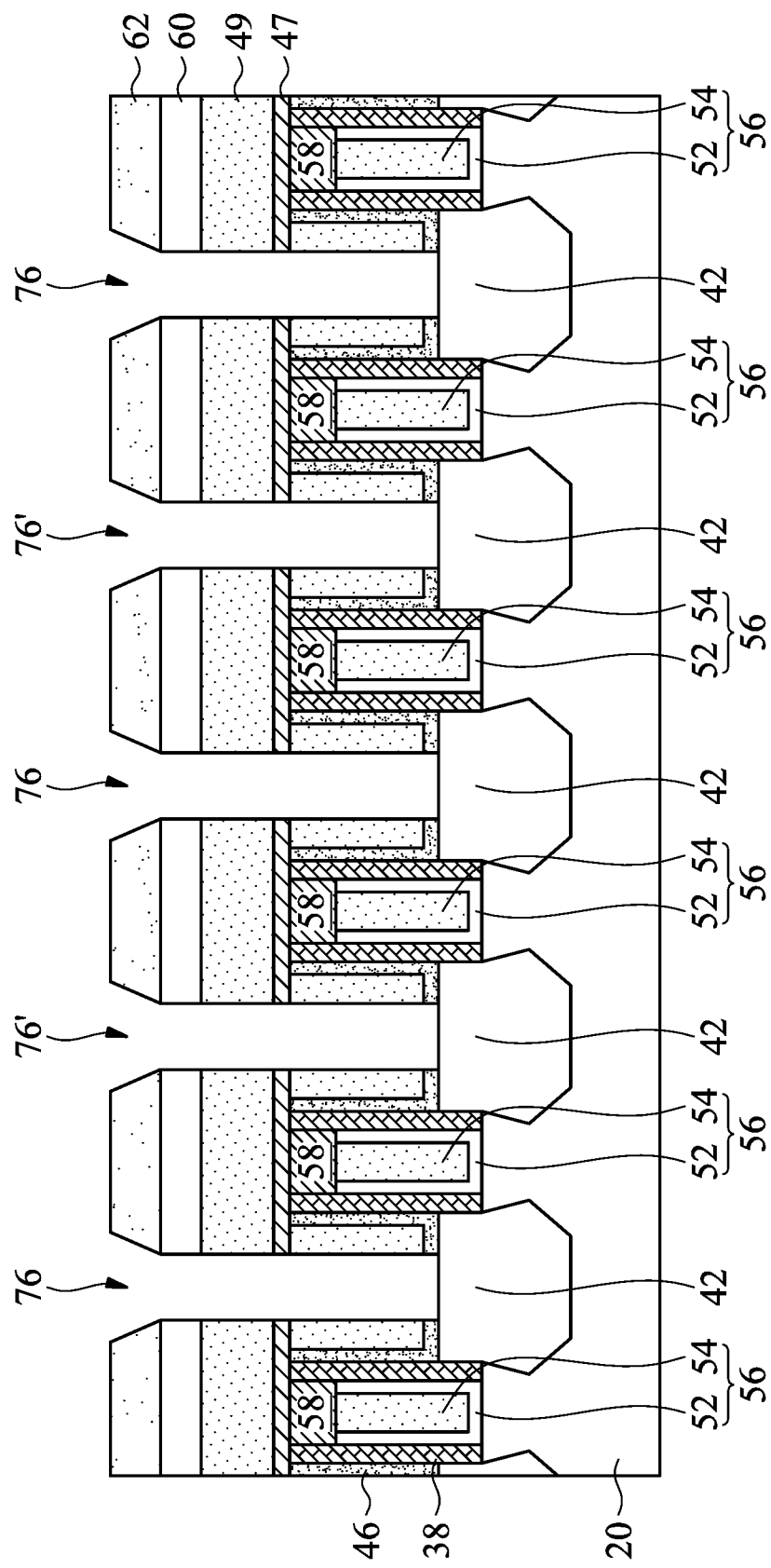

Next, the patterned hard mask layers 62 and 60 are used as an etching mask to etch the underlying ILD 49, etch stop layer 47, ILD 48, and CESL 46. The respective process is illustrated as process 222 in the process flow 200 shown in FIG. 19. The resulting structure is shown in FIGS. 17A, 17B, and 17C, wherein the portions of openings 76 and 76' in layers 46 through 49 are source/drain contact openings. In accordance with some embodiments of the present disclosure, etching masks 64 also acts as parts of the etching mask. In other embodiments, etching masks 64 are removed before etching layers 46 through 49. The removal of etching masks 64 may be isotropic or anisotropic, and may be performed using wet etch or dry etch. In accordance with some embodiments of the present disclosure, the etching process is a dry etching process performed using $CF_4$, $SO_2$, the mixture of HBr, $Cl_2$, and $O_2$, the mixture of HBr, $Cl_2$, and $O_2$, or the mixture of HBr, $Cl_2$, $O_2$, and $CF_2$ etc. Alternatively, the etching process is a wet etching process performed using KOH, tetramethylammonium hydroxide (TMAH), $CH_3COOH$, $NH_4OH$, $H_2O_2$, Isopropanol (IPA), or the solution of HF, $HNO_3$, and $H_2O$, for example.

Figure 18A:
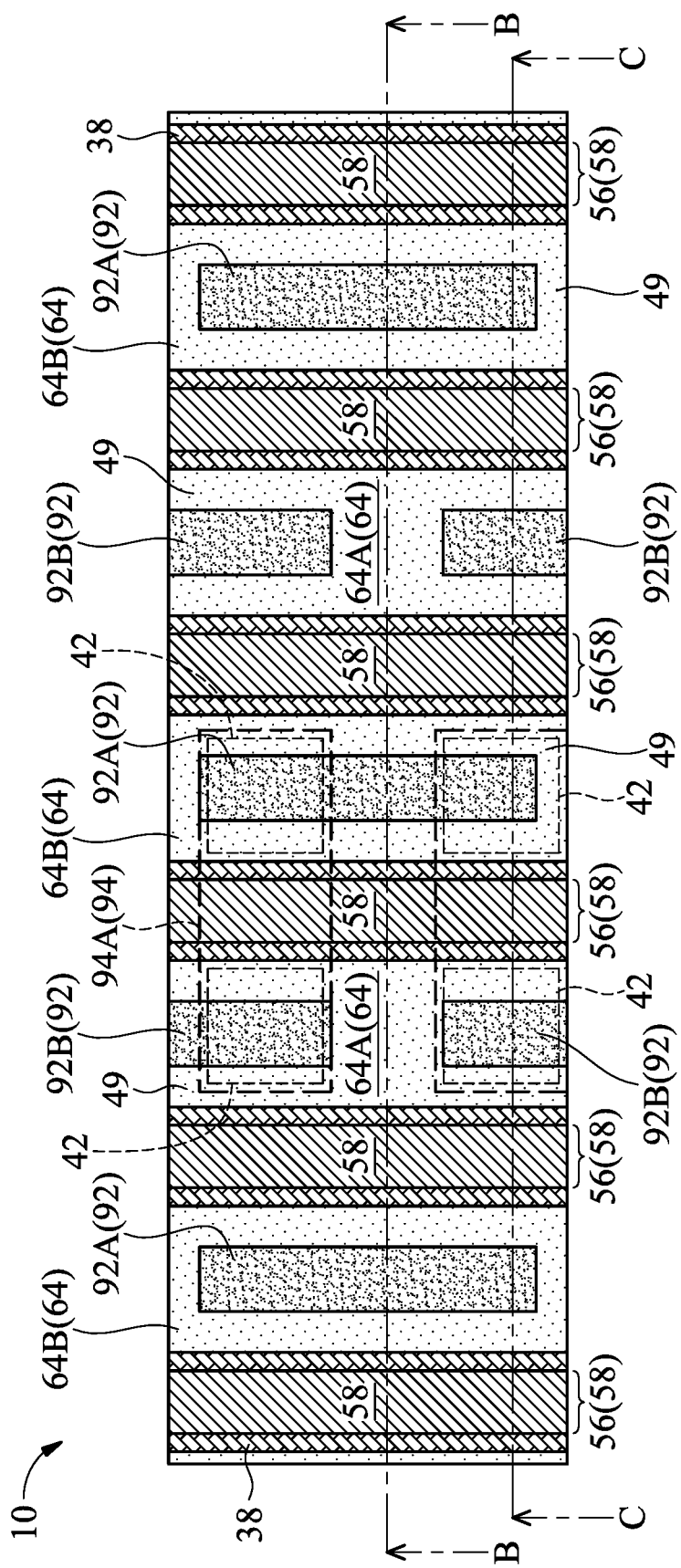
Figure 18B:
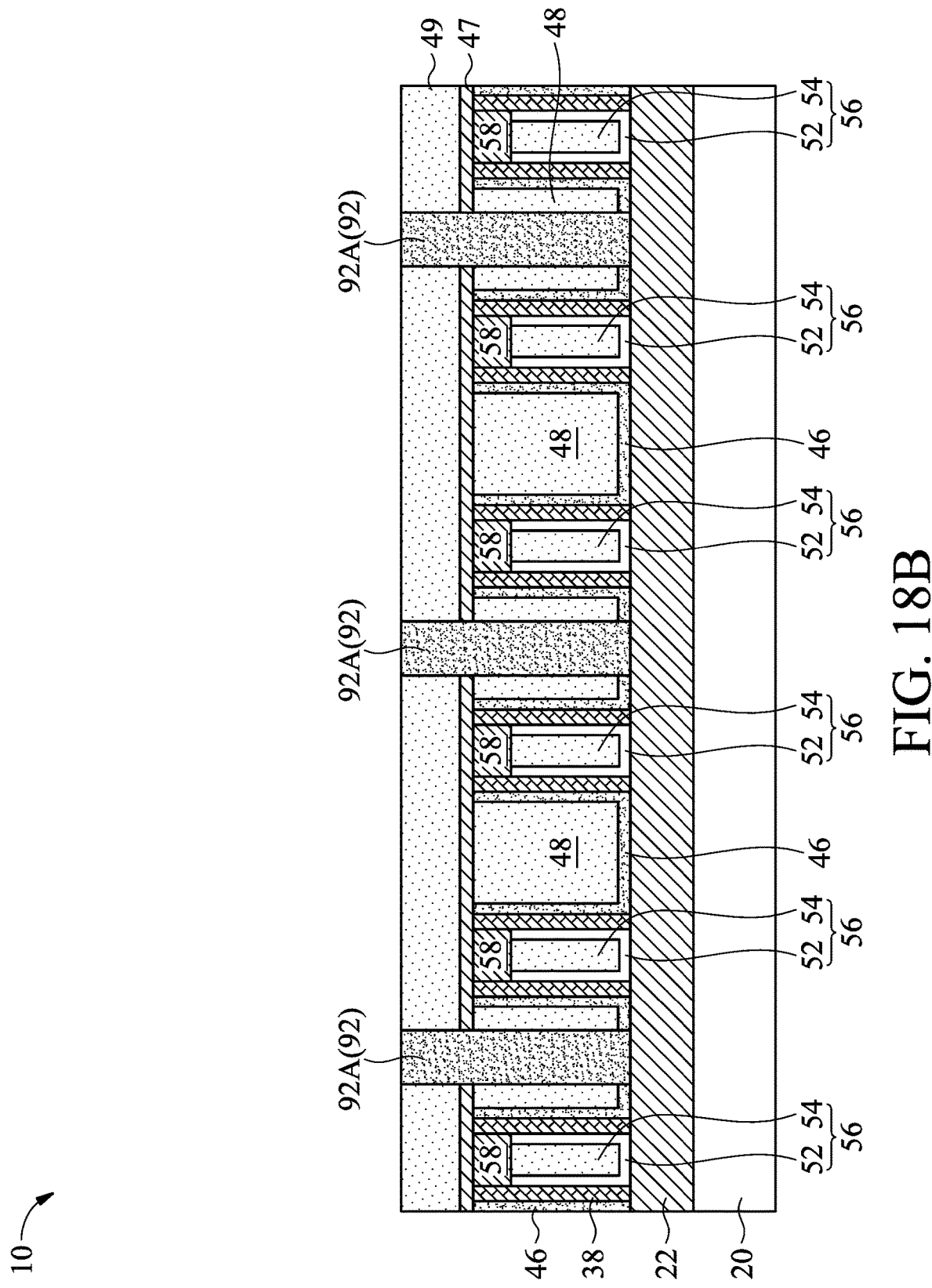
Figure 18C:
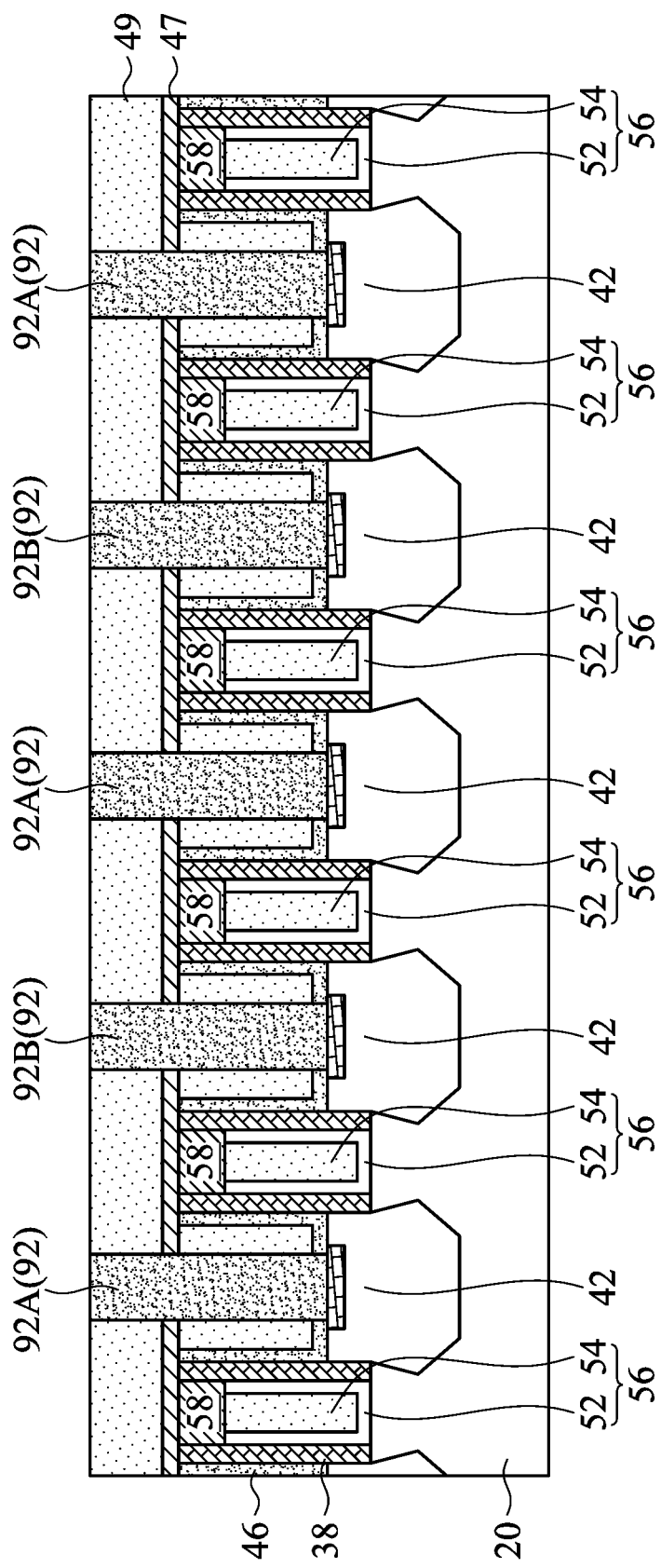
Figure 19:
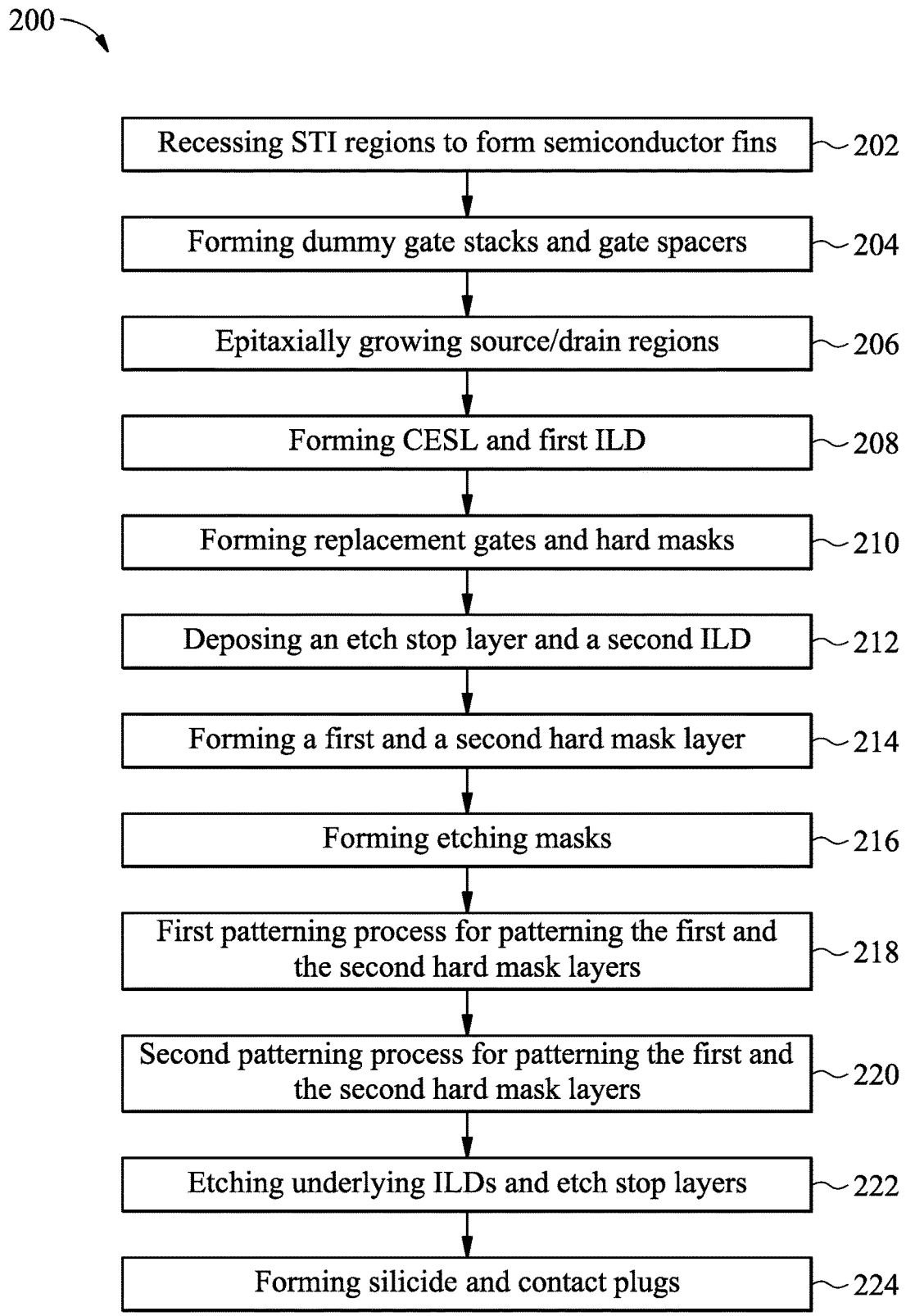
FIG. 19 illustrates a process flow for forming FinFETs in accordance with some embodiments.

FIGS. 18A, 18B, and 18C illustrate the top view and the cross-sectional views in the formation of source/drain silicide regions 90 and contact plugs 92. The respective process is illustrated as process 224 in the process flow 200 shown in FIG. 19. In accordance with some embodiments, a conformal metal layer (not shown) is deposited to extend into contact openings 76 and 76' (FIGS. 17A and 17B). The metal layer may be formed of titanium, for example. Next, an anneal process is performed, so that the portions of the metal layer located at the bottoms of contact openings 76 and 76' react with source/drain regions 42 to form source/drain silicide regions 90. The sidewall portions of the metal layer are left after the anneal process. In accordance with some embodiments, an additional conductive nitride layer (not shown) such as titanium nitride may be formed on the metal layer before the anneal process. The remaining contact openings are then filled with a metallic material, which may be formed of tungsten, cobalt, copper, aluminum, or alloys thereof. A planarization process such as a CMP process is then performed to level the top surfaces of the resulting contact plugs 92 (including 92A and 92B), which include the metal layer and the metallic material. As shown in FIG. 18A, contact plugs 92A and 92B are cut short by etching masks 64 (FIG. 10A), which define some end positions of contact plugs 92A and 92B.

Referring to FIG. 18A, a plurality of transistors 94 (including 94A and 94B) are schematically marked, wherein the source/drain regions 42 and the respective gate stacks 56 are annotated. Contact plugs 92 (such as 92A) may act as the interconnection for interconnecting the source/drain regions 42 of some transistors to the source/drain regions 42 of neighboring transistors.

The embodiments of the present disclosure have some advantageous features. The contact plugs advantageously have small widths due to the shrinking of openings. By shrinking the dimensions of openings in multiple layers, the resulting openings may have widths significantly smaller than the minimum width of the lithography process. The shrinkage methods of the embodiments of the present disclosure result in reduced likelihood of process problems since the shrinkage in each of the layers is not excessive.

In accordance with some embodiments of the present disclosure, a method includes forming a first hard mask layer; forming a second hard mask layer over the first hard mask layer; forming a tri-layer, the tri-layer comprising: a bottom layer over the second hard mask layer; a middle layer over the bottom layer; and a patterned upper layer over the middle layer; etching the middle layer using the patterned upper layer as an etching mask to extend an opening in the patterned upper layer into the middle layer, wherein the opening has a first portion in the middle layer, and the first portion has a first top width and a first bottom width smaller than the first top width; etching the bottom layer to extend the opening into the bottom layer; and etching the second hard mask layer to extend the opening into the second hard mask layer, wherein the opening has a second portion in the second hard mask layer, and the second portion has a second top width and a second bottom width smaller than the second top width. In an embodiment, the method further includes etching the first hard mask layer to extend the opening into the first hard mask layer, wherein a portion of the opening in the first hard mask layer has substantially vertical and straight sidewalls; and etching an underlying layer underlying the first hard mask layer to extend the opening into the underlying layer. In an embodiment, the method further comprises filling a conductive material into the underlying layer to form a contact plug. In an embodiment, the method further comprises removing remaining portions of the first hard mask layer and the second hard mask layer after the contact plug is formed. In an embodiment, the method further comprises forming a patterned etching mask over the second hard mask layer before the tri-layer is formed, wherein when the second hard mask layer is etched to extend the opening into the second hard mask layer, the etching mask separates the opening into two portions. In an embodiment, the first top width and the first bottom width have a first difference, the second top width and the second bottom width have a second difference, and the first top width and the second bottom width have a third difference, and the first difference is between about ⅓ and about ⅔ the third difference. In an embodiment, a portion of the opening in the bottom layer has substantially vertical and straight sidewalls.

In accordance with some embodiments of the present disclosure, a method includes forming an inter-layer dielectric over a source/drain region of a transistor; forming a first hard mask layer over the inter-layer dielectric; forming a tri-layer over the first hard mask layer comprising forming a bottom layer over the first hard mask layer; forming a middle layer over the bottom layer; and forming an upper layer over the middle layer, wherein the upper layer has an opening; etching the middle layer and the bottom layer using the upper layer as an etching mask, wherein the opening extends into the middle layer and the bottom layer, wherein widths of the opening is shrunk from a first top width at a top surface level of the middle layer to a first bottom width at a bottom surface level of the bottom layer; etching the first hard mask layer, wherein the opening extends into the first hard mask layer, wherein widths of the opening is shrunk from the first bottom width to a second bottom width at a bottom surface level of the first hard mask layer; and etching the inter-layer dielectric using the first hard mask layer as a part of an etching mask to extend the opening into the inter-layer dielectric. In an embodiment, the method further comprises forming a contact plug in the inter-layer dielectric, wherein the contact plug is electrically coupled to the source/drain region. In an embodiment, the method further includes forming a second hard mask layer over the inter-layer dielectric, wherein the second hard mask layer is underlying the first hard mask layer; and etching the second hard mask layer before the inter-layer dielectric is etched, wherein the opening extends into the second hard mask layer, and a portion of the opening in the second hard mask layer has a substantially vertical sidewall. In an embodiment, the middle layer comprises silicon oxynitride, and the middle layer is etched using a process gas comprising: a fluorine-containing gas selected from the group consisting of $CF_4$, $NF_3$, and combinations thereof; and a polymer-forming gas selected from the group consisting of $CHF_3$, $CH_2F_2$, $CH_3F$, $C_4F_6$, $C_4F_8$, and combinations thereof. In an embodiment, the method further comprises forming a patterned etching mask over the first hard mask layer before the tri-layer is formed, wherein when the first hard mask layer is etched to extend the opening into the first hard mask layer, the patterned etching mask separates the opening into two portions. In an embodiment, the forming the patterned etching mask comprises forming a silicon layer. In an embodiment, a difference between the first top width and the first bottom width is between about ⅓ and about ⅔ of a difference between the first top width and the second bottom width.

In accordance with some embodiments of the present disclosure, a method includes forming a first hard mask layer over an inter-layer dielectric; forming a second hard mask layer over the first hard mask layer; forming a tri-layer, the tri-layer comprising: a bottom layer over the second hard mask layer; a middle layer over the bottom layer; and a patterned upper layer over the middle layer, wherein an opening is formed in the patterned upper layer, and the opening has a top width; and extending the opening into the middle layer, the patterned upper layer, the second hard mask layer, and the first hard mask layer, wherein a portion of the opening in the second hard mask layer has a first top width and a first bottom width smaller than the first top width. In an embodiment, the method further comprises using one of the first hard mask layer and the second hard mask layer as an etching mask to etch an underlying layer. In an embodiment, the first bottom width is smaller than the first top width by a difference between about 12 nm and about 20 nm. In an embodiment, a portion of the opening in the middle layer has a second top width and a second bottom width smaller than the second top width, and the first top width is greater than the first bottom width by a first difference, the second top width is greater than the second bottom width by a second difference, and the first difference is between about ⅓ and about ⅔ of a sum of the first difference and the second difference.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an interlayer dielectric over a first source/drain region, a second source/drain region, and a dielectric layer;
   forming a first hard mask layer over the interlayer dielectric;
   forming a second hard mask layer over the first hard mask layer;
   forming a first tri-layer, the first tri-layer comprising:
      a first bottom layer over the second hard mask layer;
      a first middle layer over the first bottom layer; and
      a first patterned upper layer over the first middle layer;
   etching the first middle layer using the first patterned upper layer as an etching mask to extend a first opening in the first patterned upper layer into the first middle layer, wherein the first opening has a first portion in the first middle layer, and the first portion has a first top width and a first bottom width smaller than the first top width;
   etching the first bottom layer to extend the first opening into the first bottom layer, wherein a portion of the first opening in the first bottom layer has substantially vertical sidewalls;
   etching the second hard mask layer to extend the first opening into the second hard mask layer, wherein the first opening has a second portion in the second hard mask layer, and the second portion has a second top width and a second bottom width smaller than the second top width;
   etching the first hard mask layer to extend the first opening into the first hard mask layer, wherein a portion of the first opening in the first hard mask layer has substantially vertical sidewalls;
   forming a second tri-layer, the second tri-layer comprising:
      a second bottom layer over the second hard mask layer, the second bottom layer completely filling the first opening in the first hard mask layer;
      a second middle layer over the second bottom layer; and
      a second patterned upper layer over the second middle layer;
   etching the second middle layer using the second patterned upper layer as an etching mask to extend a second opening in the second patterned upper layer into the second middle layer, wherein the second opening has a third portion in the second middle layer, and the third portion has a third top width and a third bottom width smaller than the third top width;
   etching the second bottom layer to extend the second opening into the second bottom layer, wherein a portion of the second opening in the second bottom layer has substantially vertical sidewalls;
   etching the second hard mask layer to extend the second opening into the second hard mask layer, wherein the second opening has a fourth portion in the second hard mask layer, and the fourth portion has a fourth top width and a fourth bottom width smaller than the fourth top width; and
   etching the first hard mask layer to extend the second opening into the first hard mask layer, wherein a portion of the second opening in the first hard mask layer has substantially vertical sidewalls; and
   after etching the first hard mask layer to extend the first opening and after etching the first hard mask layer to extend the second opening, etching the interlayer dielectric to simultaneously extend the first opening and the second opening into the interlayer dielectric, wherein the first opening exposes the first source/drain region, wherein the second opening exposes the second source/drain region.

2. The method of claim 1 further comprising filling a conductive material into the interlayer dielectric to form a contact plug.

3. The method of claim 2 further comprising removing remaining portions of the first hard mask layer and the second hard mask layer after the contact plug is formed.

4. The method of claim 1 further comprising forming a patterned etching mask over the second hard mask layer before the first tri-layer is formed, wherein when the second hard mask layer is etched to extend the first opening into the second hard mask layer, the etching mask separates the opening into two portions.

5. The method of claim 1, wherein the first top width and the first bottom width have a first difference, the second top width and the second bottom width have a second difference, and the first top width and the second bottom width have a third difference, and the first difference is between about ⅓ and about ⅔ the third difference.

6. The method of claim 1, wherein sidewalls of the first portion of the opening are more slanted than the substantially vertical sidewalls.

7. The method of claim 1 further comprising removing the first patterned upper layer, the first middle layer, and the first bottom layer prior to etching the first hard mask layer.

8. A method comprising:
   forming an inter-layer dielectric over a first source/drain region and a second source/drain region of a transistor, the inter-layer dielectric extending over a shallow trench isolation;

forming a first hard mask layer over the inter-layer dielectric;
forming a second hard mask layer over the first hard mask layer;
forming a patterned etching mask over the second hard mask layer;
forming a first tri-layer over the second hard mask layer and the patterned etching mask, forming the first tri-layer comprising:
  forming a first bottom layer over the second hard mask layer and the patterned etching mask;
  forming a first middle layer over the first bottom layer; and
  forming a first upper layer over the first middle layer, wherein the first upper layer has a first opening;
etching the first middle layer and the first bottom layer using the first upper layer as a first etching mask, wherein the first opening extends into the first middle layer and the first bottom layer, wherein widths of the first opening is shrunk from a first top width at a top surface of the first middle layer to a first bottom width at a bottom surface of the first bottom layer, and the first bottom layer has substantially vertical sidewalls;
etching the second hard mask layer, wherein the first opening extends into the second hard mask layer, wherein widths of the first opening is shrunk from the first bottom width to a second bottom width at a bottom surface of the second hard mask layer;
removing the first upper layer, the first middle layer, and the first bottom layer;
after removing the first upper layer, the first middle layer, and the first bottom layer, etching the first hard mask layer, wherein the first opening extends into the first hard mask layer, wherein sidewalls of the first opening are more vertical through the first hard mask layer than through the second hard mask layer;
forming a second tri-layer over the second hard mask layer and the patterned etching mask, wherein forming the second tri-layer comprises:
  forming a second bottom layer over the second hard mask layer and the patterned etching mask, the second bottom layer filling the first opening in the first hard mask layer;
  forming a second middle layer over the second bottom layer; and
  forming a second upper layer over the second middle layer, wherein the second upper layer has a second opening;
etching the second middle layer and the second bottom layer using the second upper layer as a second etching mask, wherein the second opening extends into the second middle layer and the second bottom layer, wherein widths of the second opening is shrunk from a second top width at a top surface of the second middle layer to a second bottom width at a bottom surface of the second bottom layer, and the second bottom layer has substantially vertical sidewalls, wherein the patterned etching mask is exposed in the second opening;
etching the second hard mask layer, wherein the second opening extends into the second hard mask layer, wherein widths of the second opening is shrunk from the first bottom width to a second bottom width at a bottom surface of the second hard mask layer;
removing the second upper layer, the second middle layer, and the second bottom layer; and
after removing the second upper layer, the second middle layer, and the second bottom layer, etching the first hard mask layer, wherein the second opening extends into the first hard mask layer, wherein sidewalls of the second opening are more vertical through the first hard mask layer than through the second hard mask layer; and
etching the inter-layer dielectric using the first hard mask layer as a part of an etching mask to extend the first opening and the second opening through the inter-layer dielectric to the first source/drain region and the shallow trench isolation.

9. The method of claim 8 further comprising forming a first contact plug in the first opening in the inter-layer dielectric, wherein the first contact plug is electrically coupled to the first source/drain region.

10. The method of claim 8, wherein the second hard mask layer has a thickness in a range between about 15 nm and about 60 nm, and a portion of the opening in the second hard mask layer has a tilt angle smaller than about 89 degrees.

11. The method of claim 8, wherein the first middle layer comprises silicon oxynitride, and the first middle layer is etched using a process gas comprising:
  a fluorine-containing gas selected from the group consisting of $CF_4$, $NF_3$, and combinations thereof; and
  a polymer-forming gas selected from the group consisting of $CHF_3$, $CH_2F_2$, $CH_3F$, $C_4F_6$, $C_4F_8$, and combinations thereof.

12. The method of claim 8, wherein the forming the patterned etching mask comprises forming a silicon layer.

13. The method of claim 8, wherein a difference between the first top width and the first bottom width is between about ⅓ and about ⅔ of a difference between the first top width and the second bottom width.

14. The method of claim 8, wherein the first opening exposes a second source/drain region.

15. A method comprising:
forming an interlayer dielectric over a first source/drain region, a second source/drain region, a third source/drain region, and a dielectric layer adjacent the first source/drain region and the second source/drain region;
forming a first hard mask layer over inter-layer dielectric;
forming a second hard mask layer over the first hard mask layer;
forming a patterned mask over the second hard mask layer;
forming a first tri-layer, the first tri-layer comprising:
  a first bottom layer over the second hard mask layer and the patterned mask;
  a first middle layer over the first bottom layer; and
  a first patterned upper layer over the first middle layer, wherein a first opening is formed in the first patterned upper layer;
extending the first opening into the first middle layer, the first bottom layer, the second hard mask layer, and the first hard mask layer, wherein a first portion of the first opening in the second hard mask layer has a first top width and a first bottom width smaller than the first top width, and a second portion of the first opening in the first hard mask layer has a second top width and a second bottom width equal to the second top width;
after extending the first opening into the first hard mask layer, forming a second tri-layer, the second tri-layer comprising:
  a second bottom layer over the second hard mask layer, wherein the second bottom layer fills the first opening;
  a second middle layer over the second bottom layer; and a second patterned upper layer over the second middle layer, wherein a second opening is formed in the second patterned upper layer; and extending the second opening into the second middle layer, the second bottom layer, the second hard mask layer, and the first hard mask layer, wherein a first portion of the second opening in the second hard mask layer has a third top width and a third bottom width smaller than the third top width, and a second portion of the second opening in the first hard mask layer has a fourth top width and a fourth bottom width equal to the fourth top width, wherein the second opening exposes the patterned mask; and simultaneously extending the first opening and the second opening into the interlayer dielectric, wherein the first opening exposes a portion of the first source/drain region, the second source/drain region, and the dielectric layer, wherein the second opening exposes a portion of the third source/drain region.

16. The method of claim 15, wherein the first bottom width is smaller than the first top width by a difference between about 12 nm and about 20 nm.

17. The method of claim 15, wherein a third portion of the first opening in the first middle layer has a fifth top width and a fifth bottom width smaller than the fifth top width, and the first top width is greater than the first bottom width by a first difference, the fifth top width is greater than the fifth bottom width by a second difference, and the first difference is between about ⅓ and about ⅔ of a sum of the first difference and the second difference.

18. The method of claim 15, wherein the first portion of the opening in the second hard mask layer has a first tilted sidewall with a tilt angle in a range between about 85 degrees and about 30 degrees.

19. The method of claim 15, wherein extending the first opening comprises:

removing the first patterned upper layer, the first middle layer, and the first bottom layer prior to etching the first hard mask layer.

* * * * *